US011593540B1

(12) United States Patent
Popovici et al.

(10) Patent No.: US 11,593,540 B1
(45) Date of Patent: Feb. 28, 2023

(54) SYSTEMS AND METHODS FOR PERFORMING CONCURRENCY ANALYSIS IN SIMULATION ENVIRONMENTS

(71) Applicant: The MathWorks, Inc., Natick, MA (US)

(72) Inventors: Katalin M. Popovici, Natick, MA (US); Thomas G. Bolton, Natick, MA (US); Sina Yamac Caliskan, Brookline, MA (US); Ramamurthy Mani, Wayland, MA (US); Hidayet T. Simsek, Newton, MA (US)

(73) Assignee: The MathWorks, Inc., Natick, MA (US)

( * ) Notice: Subject to any disclaimer, the term of this patent is extended or adjusted under 35 U.S.C. 154(b) by 438 days.

(21) Appl. No.: 16/427,908

(22) Filed: May 31, 2019

(51) Int. Cl.
*G06F 30/20* (2020.01)
*G06F 8/41* (2018.01)
*G06F 9/48* (2006.01)
*G06F 8/34* (2018.01)
*G06Q 10/06* (2023.01)

(52) U.S. Cl.
CPC ............ *G06F 30/20* (2020.01); *G06F 8/34* (2013.01); *G06F 8/4452* (2013.01); *G06F 9/4887* (2013.01); *G06Q 10/06* (2013.01)

(58) Field of Classification Search
CPC ...... G06F 30/20; G06F 8/4452; G06F 9/4887; G06F 8/34
See application file for complete search history.

(56) References Cited

U.S. PATENT DOCUMENTS

| | | | |
|---|---|---|---|
| 7,631,168 B1 | 12/2009 | Muellers et al. | |
| 7,634,530 B2 | 12/2009 | Dean et al. | |
| 7,668,827 B2* | 2/2010 | Gould | G06F 16/168 |
| | | | 707/769 |

(Continued)

OTHER PUBLICATIONS

Bhat, Abhishek, "Concurrent Execution with Simulink Real-Time and Multicore Target Hardware," The MathWorks, Inc., 2015, pp. 1-6.

(Continued)

*Primary Examiner* — Bijan Mapar
(74) *Attorney, Agent, or Firm* — Cesari and McKenna, LLP; Michael R. Reinemann

(57) ABSTRACT

Systems and methods analyze an executable simulation model to identify existing concurrency, determine opportunities for increasing concurrency, and develop proposed modifications for realizing the opportunities for increased concurrency. The systems and methods may label locations at the simulation model where concurrency exists, and provide information regarding the proposed modifications to increase the model's concurrency. The systems and methods may modify the simulation model if the additional concurrency is accepted. The systems and methods may operate within a higher-level programming language, and may develop the proposed modifications without lowering or translating the simulation model to a lower abstraction level. The systems and methods may also undo a modification, rolling the simulation model back to a prior design state. Accepting the proposed modifications may cause the simulation models to execute more efficiently, e.g., faster.

35 Claims, 28 Drawing Sheets

(56) References Cited

U.S. PATENT DOCUMENTS

| | | | |
|---|---|---|---|
| 7,934,194 B2 * | 4/2011 | Kinnucan, Jr. | G06F 8/34 |
| | | | 717/109 |
| 8,104,017 B2 | 1/2012 | Lin et al. | |
| 8,352,505 B1 | 1/2013 | Venkataraman et al. | |
| 8,402,411 B1 | 3/2013 | Koh et al. | |
| 8,402,449 B1 | 3/2013 | Biswas et al. | |
| 8,522,196 B1 * | 8/2013 | Kim | G06F 11/3664 |
| | | | 717/105 |
| 8,756,044 B2 | 6/2014 | Mani et al. | |
| 8,880,682 B2 * | 11/2014 | Bishop | G06Q 10/06 |
| | | | 709/224 |
| 8,904,367 B1 | 12/2014 | Biswas et al. | |
| 8,984,494 B1 * | 3/2015 | Carrick | G06F 8/70 |
| | | | 717/131 |
| 8,990,739 B2 | 3/2015 | Gu et al. | |
| 8,990,783 B1 * | 3/2015 | Yu | G06F 9/4887 |
| | | | 717/131 |
| 9,038,016 B2 * | 5/2015 | Kinnucan, Jr. | G06F 9/4492 |
| | | | 717/105 |
| 9,075,706 B2 * | 7/2015 | Perrin | G06F 7/00 |
| 9,083,734 B1 * | 7/2015 | Bishop | H04L 63/1433 |
| 9,489,283 B1 * | 11/2016 | Popovici | G06F 11/3636 |
| 9,558,305 B1 | 1/2017 | Popovic et al. | |
| 10,025,566 B1 * | 7/2018 | Ahmed | G06F 8/4452 |
| 10,114,917 B1 | 10/2018 | Venkataraman et al. | |
| 10,318,668 B2 * | 6/2019 | Broodney | G06F 30/20 |
| 10,585,648 B2 * | 3/2020 | Szpak | G06F 30/33 |
| 10,705,800 B2 * | 7/2020 | Brunel | G06F 11/3604 |
| 10,949,211 B2 * | 3/2021 | Memon | G06N 3/02 |
| 2008/0092109 A1 * | 4/2008 | Kinnucan | G06F 8/10 |
| | | | 717/105 |
| 2010/0175045 A1 | 7/2010 | Ciolfi et al. | |
| 2011/0072353 A1 * | 3/2011 | Le Pennec | H04L 43/067 |
| | | | 715/737 |
| 2011/0145657 A1 * | 6/2011 | Bishop | H04L 43/04 |
| | | | 714/47.1 |
| 2017/0266130 A1 * | 9/2017 | Cohen | A61K 31/728 |
| 2018/0157471 A1 * | 6/2018 | Venkataramani | G06F 8/4441 |
| 2020/0192327 A1 * | 6/2020 | Khoo | G05B 19/4069 |

OTHER PUBLICATIONS

"DPS Design Flow: User Guide," Altera, Altera Corporation, Jun. 2009, pp. 1-36.

"HDL Coder™: User's Guide," R2018a, The MathWorks, Inc., Mar. 2018, pp. 1-1516.

"Simulink® User's Guide: R2018a," The MathWorks, Inc., Mar. 2018, pp. 1-4212.

Sommer, R., et al., "From System Specification to Layout: Seamless Top-Down Design Methods for Analog and Mixed-Signal Applications," IEEE, IEEE Computer Society, Proceedings of the 2002 Design, Automation and Test in Europe Conference and Exhibition (Date'02), Mar. 2002, pp. 1-8.

* cited by examiner

| Model Element | Execution Cost (ms) | |
|---|---|---|
| Inport | 10 | — 506a |
| Constant | 10 | — 506b |
| Color Space Conversion | 40 | — 506c |
| MATLAB Function | 36 | — 506d |
| Blk2 Subsystem | 430 | — 506e |
| Create Scanlines Subsystem | 568 | — 506f |
| Draw Lines Subsystem | 439 | — 506g |
| Outport1 | 10 | — 506h |
| Outport2 | 10 | — 506i |

FIG. 5

SYSTEMS AND METHODS FOR PERFORMING CONCURRENCY ANALYSIS IN SIMULATION ENVIRONMENTS

BRIEF DESCRIPTION OF THE DRAWINGS

The description below refers to the accompanying drawings, of which:

FIG. 5 is a schematic illustration of an example execution costs store in accordance with one or more embodiments;

DETAILED DESCRIPTION OF ILLUSTRATIVE EMBODIMENTS

Figure 1:
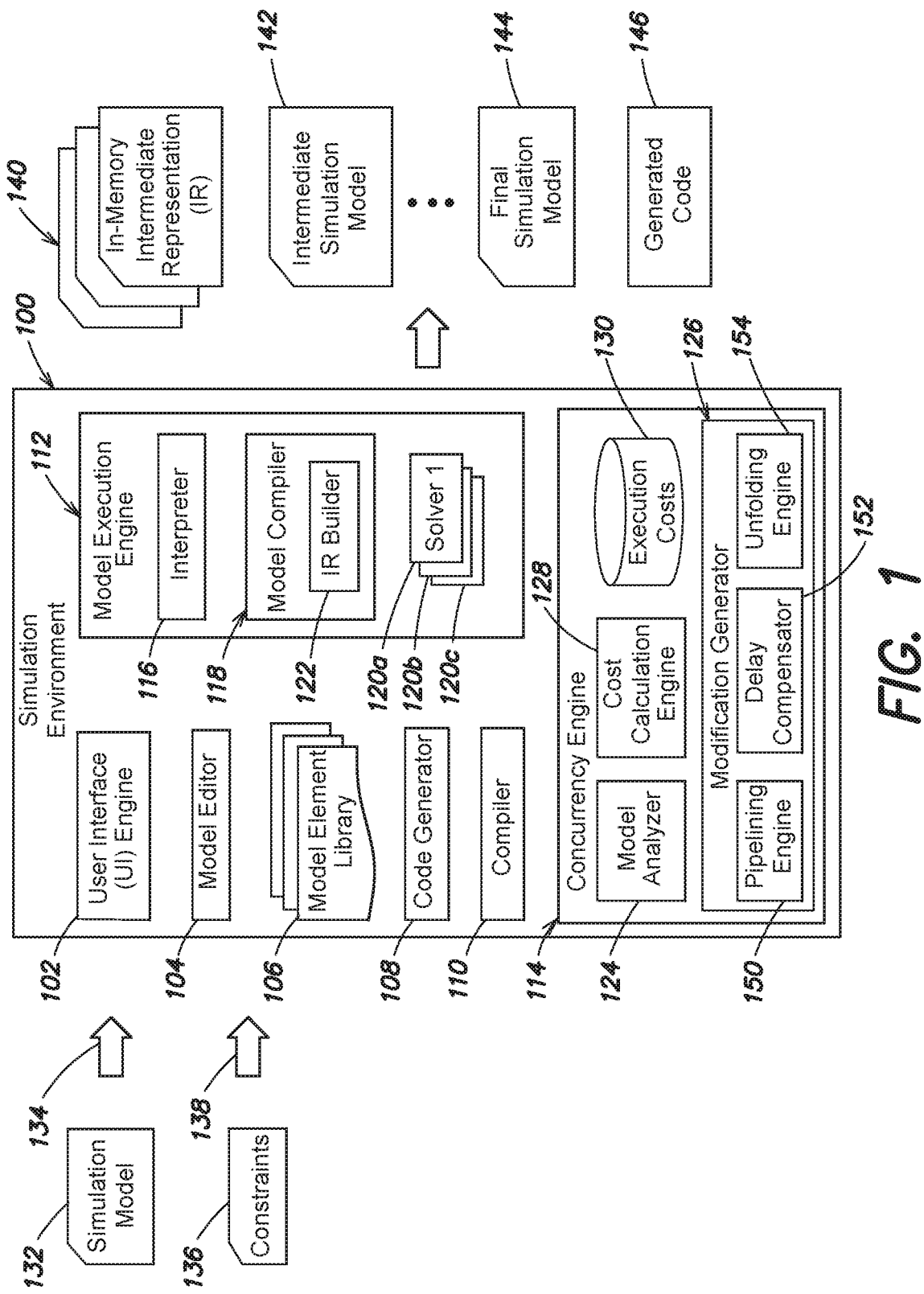
FIG. 1 is a schematic, partial illustration of an example simulation environment in accordance with one or more embodiments.

In serial, e.g., sequential, computing, an operating system creates a single thread of execution or control for running a computer program. A new computation of the program starts only when the current computation completes. In concurrent computing, the operating system creates multiple, independent threads, and one thread can begin or resume computations without waiting for the computations of other threads to complete. All of the threads may access a shared memory, and may communicate with each other by reading and writing data to locations of the shared memory. The threads may run simultaneously, for example on different processing cores of a multiprocessor or on different processors. Concurrent computing requires multiple processors and/or cores because the different threads may overlap.

Briefly, the present disclosure relates to systems and methods for statically and/or dynamically analyzing graphical models, identifying existing concurrency in the models, determining opportunities for increasing concurrency, developing proposed modifications to the model that, if made, realize the opportunities for additional concurrency, and presenting the proposed modifications to the model, which can be accepted or declined, e.g., by a user. In some cases, the graphical models may be simulation models that simulate the behavior of physical systems. The systems and methods may apply techniques, such as partitioning, pipelining, substitution, and/or unfolding, to determine the opportunities for increasing concurrency. Accepting the proposed modifications may cause the simulation models to execute more efficiently, e.g., faster or with higher throughput.

The systems and methods may place graphical affordances, such as labels, on a visual depiction of a simulation model. The labels may mark locations where concurrency exists and provide information on the identified existing concurrency. The systems and methods may place other graphical affordances, such as other labels, marking locations where additional concurrency may be introduced into the simulation model, based on an analysis of the simulation model. These other labels may include information describing the proposed modifications and the resulting increase to concurrency, if the proposed modifications are accepted. Additional information, such as one or more tradeoffs in accepting the modification and increasing the concurrency, may also be determined and presented, e.g., as part of these other labels. In some embodiments, the proposed modifications may be accepted incrementally, e.g., by a user, and the systems and methods may evaluate the change in the model's concurrency at each incremental acceptance of a proposed modification. For example, the systems and methods may re-analyze the model after each proposed modification is accepted to evaluate the change to the model's concurrency. The systems and methods may undo a modification, for example in response to user input declining or rejecting the change to concurrency, thereby rolling the model back to a prior design state.

If a proposed modification is accepted, e.g., by a user, the systems and methods may determine the manner by which that proposed modification will be made to model, including where in the model it will be made. In some embodiments, the systems and methods may present information about where in the model the modification will be made, e.g., where to increase latency and what is the recommended latency value. If the user accepts the recommended latency value, the systems and methods may use that information to modify, e.g., re-pipeline, at least a portion of the model, such as the contents of a subsystem block of a model, with the recommended latency value. The systems and methods may determine how to distribute the recommended latency within the subsystem block, such as where to place pipeline stages.

While the systems and methods may suggest, and the user may accept, increasing end-to-end latency by a recommended value for a subsystem, the systems and methods may determine how to distribute that latency within the subsystem.

Furthermore, the systems and methods may relocate accepted modifications as additional modifications are accepted and entered in the model. For example, the systems and methods may re-analyze a model after a latency recommendation is accepted by the user, which may identify additional concurrency opportunities in the model. The additional concurrency opportunities may produce a different number of threads and/or a different allocation of portions of the model, such as model element or blocks, to threads.

Graphical models may be created within an environment, such as a simulation environment that includes an execution engine for running the simulation model. The simulation environment may provide one or more libraries containing model element types, and instances of the model element types may be selected and used to create a given model that simulates a system, such as a control system, signal-processing system, infotainment system, computer vision system, or other physical system. The concurrency analysis of the given model may include determining execution costs associated with at least some of the model elements included in the given model. The execution costs associated with model elements may be obtained in a number of different ways. For example, a user may provide or supply execution costs of one or more model elements. In other embodiments execution costs may be measured by a model profiler, which may run the model and/or model elements on target hardware and measure the execution time. Execution costs may also be estimated by generating an Intermediate Representation (IR) of a model or portion thereof, and performing node level estimations on the IR. Estimated execution costs may be independent of any particular target processor and/or machine. The estimation may provide execution costs of low fidelity as compared to the other methods. Furthermore, the estimated execution costs may be non-dimensional. Nonetheless, a computed cost value may represent the algorithmic complexity of the respective IR node, which can then be compared to the execution costs estimated for other IR nodes. In still other embodiments, execution costs may be provided by a hardware vendor, who may determine the number of cycles to execute particular model elements on the vendor's target hardware, such as an ARM processor, using Single Instruction Multiple Data (SIMD) instructions.

The systems and methods may perform a cost analysis for the existing concurrency identified in the model and/or for the proposed modifications based on the determined execution costs for the given model. The systems and methods may present the results of the cost analysis in the visual depiction of the model, e.g., using one or more graphical affordances. Based on the determined cost, a user may choose to have existing concurrency executed concurrently or sequentially, and/or may decline a proposed modification for additional concurrency. In some embodiments, the systems and methods may compute the execution costs associated with a proposed modification, and automatically without user intervention discard the proposed modification if the computed execution costs exceed a threshold.

The graphical model, as modified, may be executed within the simulation environment, e.g., by the execution engine, realizing the increase in concurrency. Alternatively, the systems and methods may automatically generate code, such as C code, HDL code, etc., from the graphical model, as modified, where the generated code also realizes the increase in concurrency from the modifications as compared to code generated for the original model.

In some embodiments, the systems and methods may obtain information on a target processor and/or machine on which a graphical model (or code generated therefor) is to be is to be run, e.g., executed. The information may indicate a concurrent processing capability of the target processor and/or machine. For example, the information may indicate the number of processing cores of the target processor. The systems and methods may utilize the target processor's concurrent processing capability when devising the proposed modifications, such that the proposed modifications are tailored to, e.g., exploit, that capability.

In some embodiments, the systems and methods may receive a latency budget for the analysis of a graphical model. The systems and methods may consider the latency when devising the proposed modifications. For example, the systems and methods may discard potential modifications, e.g., pipelining, if the resulting latency exceeds the latency budget.

In some embodiments, the systems and methods may mark or flag a portion of a model that the systems and methods cannot analyze. In some cases, the systems and methods may analyze a model at a block-by-block level of granularity, but may not analyze inside a block. A user may alter the flagged portion so that it may be analyzed by the systems and methods. For example, the user may break-up the flagged portion into parts. The systems and methods may then proceed to analyze the model, e.g., after it has been altered by the user.

The systems and methods may replicate a block via unfolding to produce more blocks running in parallel, thereby increasing parallelism.

The concurrency analysis may be performed on an in-memory, intermediate representation (IR) of the model. The IR may represent how the model elements of the model are executed, for example via generated code. This can result in more accurate cost estimation as compared to cost estimations performed on a graph representation of a model.

FIG. 1 is a schematic, partial illustration of an example simulation environment 100 in accordance with one or more embodiments. The simulation environment 100 may include a User Interface (UI) engine 102, a model editor 104, one or more model element libraries 106, a code generator 108, a compiler 110, a model execution engine 112, and a concurrency engine 114. The UI engine 102 may create and present one or more User Interfaces (UIs), such as Graphical User Interfaces (GUIs) and/or Command Line Interfaces (CLIs), on the display of a workstation, laptop, tablet, or other data processing device. The GUIs and CLIs may provide a user interface to the simulation environment 100, such as a model editing window. Other GUIs and CLIs may be generated as user interfaces to the concurrency engine 114. The one or more model element libraries 106 may contain model element types, at least some of which may come preloaded with the simulation environment 100, while others may be custom created and saved in the libraries 106, e.g., by a user. A user may select model element types from the libraries 106, and the model editor 104 may add instances of the selected model element types, e.g., blocks, to a simulation model being created and/or edited. The model editor 104 may also perform selected operations on a simulation model, such as open, create, edit, and save, in response to user inputs or programmatically.

The model execution engine 112 may include an interpreter 116, a model compiler 118, and one or more solvers, such as solvers 120*a-c*. During execution of a model, the model execution engine 112 may successively compute states and outputs of the model elements included in the model at particular simulation time steps from a simulation start time to a simulation end time. At each step, new values for the model element's inputs, states, and outputs may be computed, and the model elements may be updated to reflect the computed values. The length of time between steps is called the step size. Exemplary solvers include one or more fixed-step continuous time solvers, which may utilize numerical integration techniques, and one or more variable-step solvers, which may for example be based on the Runge-Kutta and Dormand-Prince pair. With a fixed-step solver, the step size remains constant throughout simulation of the model. With a variable-step solver, the step size can vary from step to step, for example to meet error tolerances. A non-exhaustive description of suitable solvers may be found in the *Simulink User's Guide* from The MathWorks, Inc. (September 2018 ed.)

The model compiler 118 may include one or more Intermediate Representation (IR) builders, such as IR builder 122. In some implementations, one or more IR builders may be included or associated with the solvers 120. The IR builder 122 may construct one or more IRs for a simulation model and these IRs may be used by the interpreter 116 to run, e.g., simulate or execute, the model. Alternatively or additionally, one or more of the IRs may be used by the code generator 108 to generate code. The IRs may be data structures that represent a graphical model. They may be stored in-memory and may be accessed by the model execution engine 112 and/or the code generator 108.

The concurrency engine 114 may include a model analyzer 124, a modification generator 126, and a cost calculation engine 128. The concurrency engine 114 may also include or have access to one or more data structures, such as a data store 130, that may contain execution costs determined for at least some of the model elements included in a model being analyzed for concurrency. The modification generator 126 may include a pipelining engine 150, a delay compensator 152, and an unfolding engine 154.

In some embodiments, the simulation environment 100 and/or the concurrency engine 114 may be implemented through one or more software modules or libraries containing program instructions that perform the methods described herein, among other methods. The software modules may be stored in one or more memories, such as a main memory, a persistent memory, and/or a computer readable media, of a data processing device, and may be executed by one or more processors. Other computer readable media may also be used to store and execute these program instructions, such as one or more non-transitory computer readable media, including optical, magnetic, or magneto-optical media. In other embodiments, one or more of the simulation environment 100 and/or the concurrency engine 114 may be implemented in hardware, for example through hardware registers and combinational logic configured and arranged to produce sequential logic circuits that implement the methods described herein. In other embodiments, various combinations of software and hardware, including firmware, may be utilized to implement the systems and methods of the present disclosure.

FIG. 1 is for illustrative purposes only and the present disclosure may be implemented in other ways. For example, in some embodiments, the concurrency engine 114 may be included in the model execution engine 112 or another component or module. In other embodiments, two or more parts of the concurrency engine 114 may be combined into a single part and/or one or more parts may be split into multiple parts.

The simulation environment 100 may access a simulation model 132, e.g., from a computer memory or transmitted from a local or remote device, etc., as indicated by arrow 134. The simulation model 132 may be an executable graphical model. For example, it may be an executable block diagram model. The simulation environment 100 may also receive one or more constraints 136, as indicated by arrow 138. The constraints 136 may direct and/or control the concurrency analysis performed by the concurrency engine 114 on the simulation model 132. The constraints 136 may include information on a target processor and/or machine, such as the number of processing cores of a target processor on which the simulation model 132 will be run, a latency budget for concurrency analysis, a designation that a particular block execute on a specific processing core, a designation that a set of model elements of the model be executed on a specific processing core thereby indicating that the model elements should not be split up as part of the concurrency analysis, a designation that the concurrency analysis should not be performed on one or more portions of the model, such as one or more model elements, and a designation that the concurrency analysis should minimize memory usage, for example by keeping model elements that exchange a large amount of data together. For example, the systems and methods may statically or dynamically analyze the model 132 to determine whether connected model elements exchange data exceeding a threshold, such as 100 MB of data, during execution of the model 132. If so, and if the execution cost of the model elements, e.g., in milliseconds (ms), is low, then the systems and methods may not perform concurrency analysis on the two model elements. The model execution engine 112 may execute the model 132 such that the two model elements are executed by the same core. In some cases, a data sheet may be available for the processor that is to run the model 132. The data sheet may indicate the number of cycles for read/write operations from/to memory by the cores of the processor. The concurrency engine 114 may determine whether the cost of the memory read/write operations exceeds the execution costs of the model elements exchanging data. If so, the concurrency engine 114 may direct the execution engine 112 to execute the two model elements on the same core, as running the two model elements on different cores may not improve the overall model execution performance.

The IR builder 122 may create one or more in-memory, intermediate representations (IRs) indicated at 140 for the model 132. The currency engine 114 may analyze one or more of the IRs 140 to identify existing concurrency in the simulation model 132 and to develop one or more suggested modifications for increasing concurrency. One or more of the suggested modifications may be accepted, resulting in the creation of one or more intermediate simulation models indicated at 142. At the conclusion of the concurrency analysis, a final simulation model indicated at 144 may be produced. The intermediate and final simulation models 142 and 144 may be modified versions of the original simulation model 132. The code generator 108 may automatically generate code, such as generated code 146, from the final simulation model 144.

Figure 2:
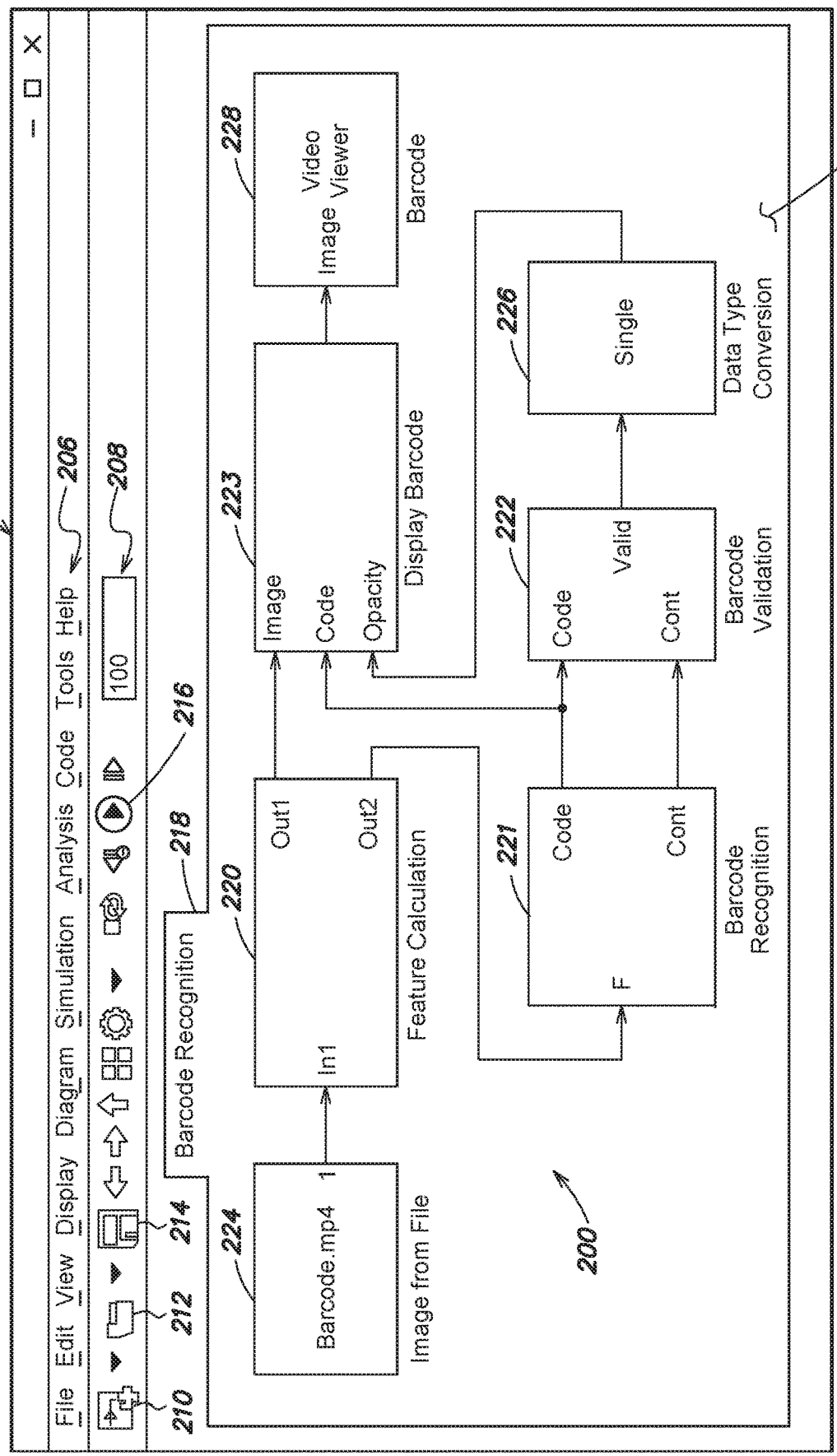
FIG. 2 is an illustration of an example simulation model in accordance with one or more embodiments.

FIG. 2 is an illustration of an example simulation model 200 according to one or more embodiments. The simulation model 200 may be opened from within the simulation environment 100, and visually presented on a display of a data processing device. For example, the UI engine 102 may generate a model editor window 202 that includes a canvas 204, and the model 200 may be presented on the canvas 204. In addition to the model canvas 204, the model editor window 202 may include a menu bar 206 and a toolbar 208. The menu bar 206 may include a plurality of commands arranged in drop down lists, such as File, Edit, View, Display, etc. The toolbar 208 may include a plurality of buttons for commonly used commands, such as a New button 210, an Open button 212, a Save button 214, and a Run button 216, among others. In response to a user selecting the Run button 216, for example by using a mouse to control a cursor, the model execution engine 112 may execute the model 200. The model editor window 202 also may include an explorer bar 218 that may provide a hierarchical list of components included in the model 200.

To construct or edit a model, such as the model 200, the UI engine 102 may present one or more palettes that list various model element types from the model element library 106. In response to user selection of desired model element types from the palettes, the model editor 104 may place instances, e.g., blocks, of the selected model element types onto the model canvas 204. The model editor 104 also may establish relationships, such as connections, among elements of the model, which may or may not be visually represented on the model canvas 204, for example in response to user input. Elements of the model 200 may represent dynamic systems, computations, functions, operations, data stores, events, states, state transitions, etc., and the connections, which if visible may appear as arrows or lines among the objects, may represent data, control, signals, events, mathematical relationships, state transitions, physical connections, etc.

A group of model elements may be contained within a component of the model. Exemplary components include superblocks, subsystems, model references, sub-models, state charts, subcharts, Virtual Instruments (VIs), subVIs, etc. A component may be visually represented within the model as a single element, such as a subsystem block or a model reference block. While these block types may help organize a model graphically, they may play no active role in the simulation of the model, but may instead, and may be referred to as virtual blocks. Model elements that do play an active role in the simulation of a model may be referred to as non-virtual blocks. A component may itself contain other components, establishing multiple hierarchical levels within a model. Components may include input ports and output ports, and input/output dependencies may extend across hierarchical levels of a model.

The model 200 may implement a barcode recognition process. The model 200 may include four subsystems 220-223 named 'Feature Calculation', 'Barcode Recognition', 'Barcode Validation', and 'Display Barcode'. The model 200 may also include an Image From File block 224, a Data Type Conversion block 226, and a Video Viewer block 228 named 'Barcode'.

During execution, the Image From File block 224 may provide an image, such as a videostream, that includes barcodes to the Feature Calculation subsystem 220. The Feature Calculation subsystem 220 may search rows, e.g., scanlines, of the received image, and translate the pixels of the scanlines into feature values. The Feature Calculation subsystem 220 may set the feature value of a pixel to a 1, if the pixel is considered black, −1 if it is considered white, and a value between −1 and 1 otherwise. The Feature Calculation subsystem 220 may provide the scanlines with transformed pixels to the Barcode Recognition subsystem 221 for analysis. The Barcode Recognition subsystem 221 may identify the sequence and location of guard patterns and symbols. It may also upsample and compare the symbols with a codebook to determine the corresponding code for the barcode being analyzed. The Barcode Validation subsystem 222 may determine whether the recognized code is valid. The valid/invalid determination may be provided by the Barcode Validation subsystem 222 to the Data Type Conversion block 226. The Display Barcode subsystem 223 may receive the input image, the recognized code, and the output of the Data Type Conversion block 226. The Display Barcode subsystem block 223 may construct an output image that includes the input image and the recognized code. The Display Barcode subsystem 223 may provide the constructed output image to the Video View block 228, which may send the output image to a display device.

The number and location of the scanlines can be changed by changing the value of a "Row Positions Of Scanlines" subsystem parameter of the Feature Calculation subsystem 220.

It should be understood that FIG. 2 is an illustration of a visual depiction of the model 200. An in-memory representation of the model 200 may also be created, e.g., by the model editor 104. The in-memory representation may be a data structure that includes a list of the elements of the model 200, and identifies relationships, e.g., connections, among the model's elements. The data structure may be stored in memory of a data processing device. The model editor 104 may utilize this data structure to create the visual representation. For example, elements of the in-memory representation may map to icons used in a visual depiction of the model 200.

It should be understood that the example model 200 is for illustrative purposes only, and that the present disclosure may be used other possibly far more complex models.

The concurrency engine 114 may analyze the model 200 or a portion thereof, such as one or more components of the model 200, e.g., in response to user input. For example, the concurrency engine 114 may analyze the Feature Calculation subsystem 220 in response to user selection of the Feature Calculation subsystem 220, e.g., by selecting a command button or entering a command at a Command Line Interface (CLI). In addition, the concurrency engine 114 may receive a latency budget for the model 200 or the portion, e.g., the Feature Calculation subsystem 220. The latency budget may be set programmatically or by the user, e.g., graphically or textually. For example, the UI engine 102 may present a graphical affordance, such as a property page, for the Feature Calculation subsystem 220, and the user may enter a value for the latency budget.

Figure 3:
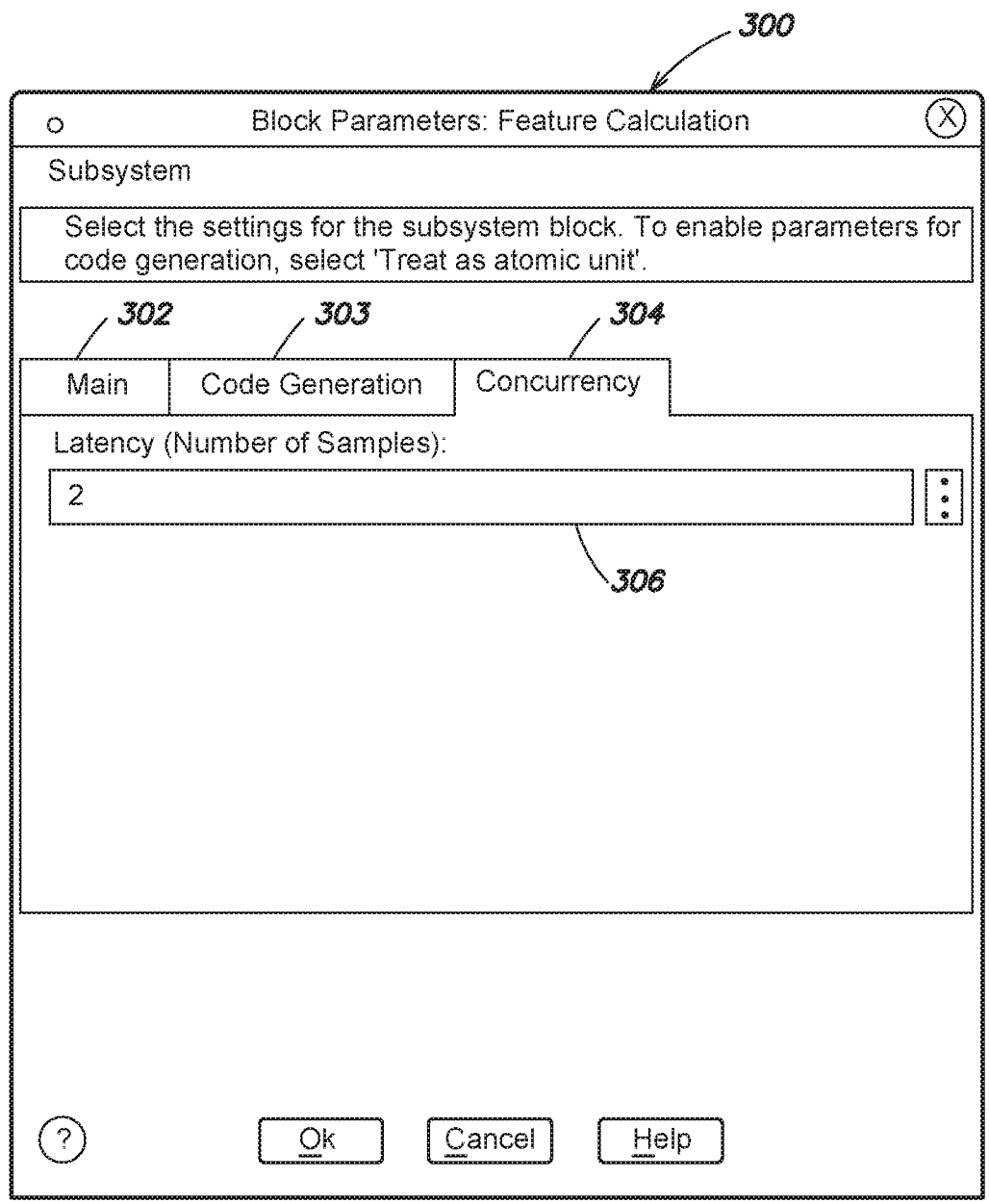
FIG. 3 is an illustration of an example user interface in accordance with one or more embodiments.

FIG. 3 is an illustration of an example user interface 300 in accordance with one or more embodiments. The user interface 300 may be in the form of a dialog for setting values for parameters of the Feature Calculation subsystem 220. The dialog 300 may include a Main tab 302, a Code Generation tab 303, and a Concurrency tab 304, which is opened. The Concurrency tab 304 may include a data entry box 306 for setting a latency budget for the Feature Calculation subsystem 220. A user may enter a value, e.g., 2, in the data entry box 306. In response, the concurrency engine 114 may set the concurrency budget for that component, e.g., the Feature Calculation subsystem 220, to the specified value, e.g., 2.

Figure 4:
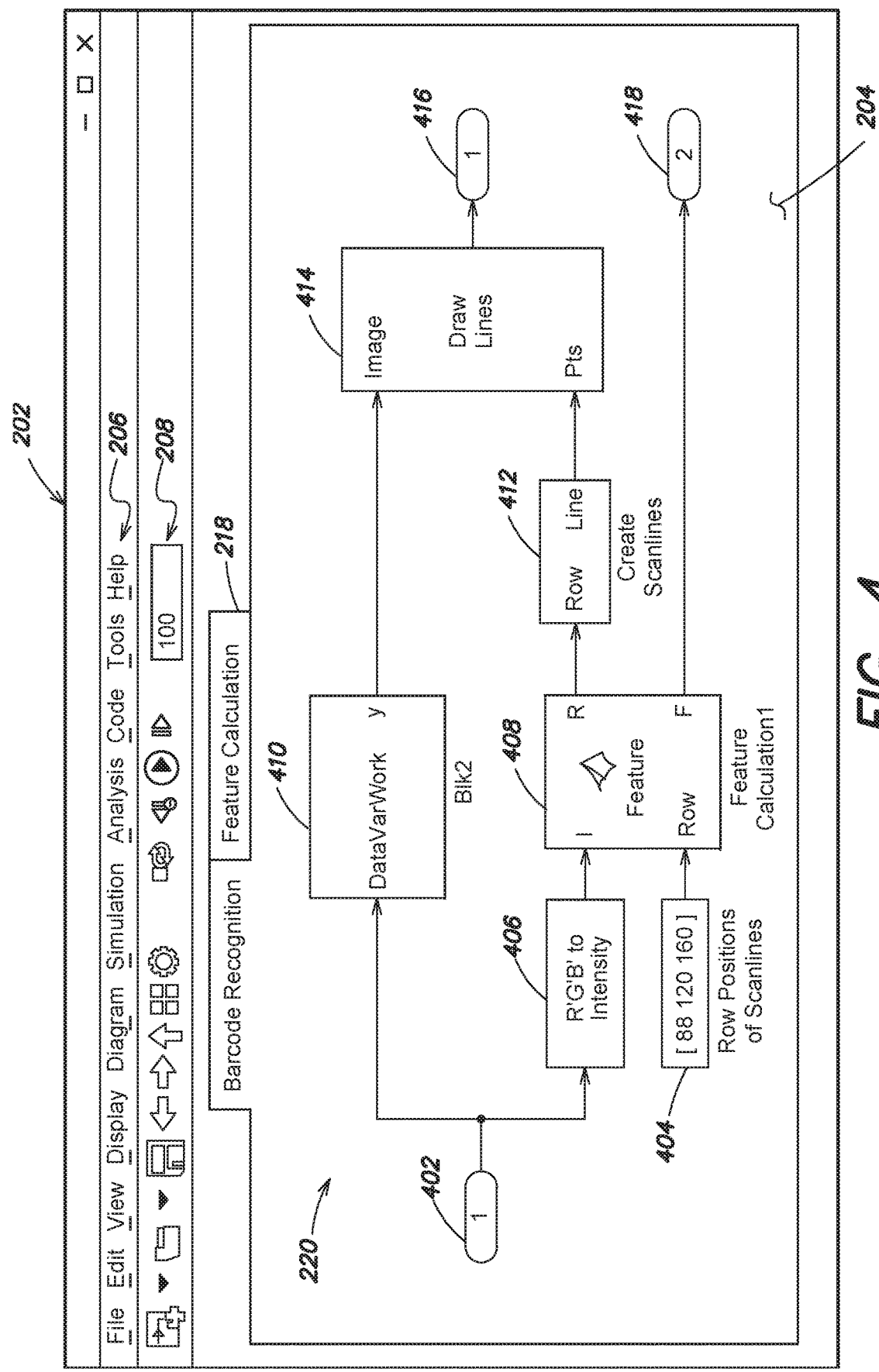
FIG. 4 is an illustration of an example subsystem in accordance with one or more embodiments.

FIG. 4 is an illustration of the model elements contained in the Feature Calculation subsystem 220 in accordance with one or more embodiments. The Feature Calculation subsystem 220 may contain an Inport block 402, a Constant block 404, a Color Space Conversion block 406 that converts an image in RGB color space to the YCbCr color space, a MATLAB function block 408, three subsystems 410, 412, and 414 named 'Blk2', 'Create Scanlines', and 'Draw Lines', and two Outport blocks 416 and 418.

The model analyzer 124 may analyze the Feature Calculation subsystem 220, and determine whether the functionality defined by the Feature Calculation subsystem 220, as presently configured, can be run concurrently. The model analyzer 124 may also determine whether there are one or more proposed modifications that, if made to the Feature Calculation subsystem 220, will increase the concurrency. In some embodiments, the model compiler 118 may compile the Feature Calculation subsystem 220. The model compiler 118 may compile the model 200 including the Feature Calculation subsystem 220. For example, the IR builder 122 may construct one or more in-memory IRs for the model 200 or one or more portions thereof. The model analyzer 124 may analyze one or more of the in-memory IRs to identify existing concurrency, if any, and to determine whether any proposed modifications can be made for increasing the concurrency.

The generation of the one or more IRs may be performed as part of the compile and link stages of model execution. The compile stage may involve preparing data structures and evaluating parameters of the model 200 (and/or the Feature Calculation subsystem 220) to determine their values, determining connectivity among model elements and components, configuring and propagating block characteristics (e.g., data dimensions, data types, numerical complexity, sample times, etc.), checking signal compatibility, flattening the model's hierarchy, performing optimizations, such as block reduction and block insertion, and determining a sorted order of the blocks or the equations corresponding to the blocks of the model 200. The model execution engine 112 may also establish other execution schedules, such as state-based, event-based, and/or message-based execution schedules.

One or more of the IRs 140 generated for the model 200 may be implemented as a graph, e.g., a directed acyclic graph, that includes a plurality of nodes and edges. At least some of the nodes of the IR may represent model elements, e.g., blocks, states, etc., and the edges may represent signals, events, state transitions, physical relationships, or other connections or dependencies, among model elements. Nodes and edges may be implemented through one or more data structures stored in a memory. The data structures for the edges may include pointers. The data structure for a given node may include information identifying the type of model element associated with the given node, a unique identifier (ID) assigned to the model element, e.g., by the model editor 104, and the execution costs associated with the given node. In some embodiments, special nodes, called network instance components (NICs), may be used to provide hierarchy in the IR by abstractly representing components or other virtual blocks of the model. In some embodiments, such special nodes may be removed, and the hierarchical graph representing the model may be flattened. The graph constructed by the IR builder 122 may have a similar or even the same structure as the interconnected model elements of the model.

Exemplary graphs include a Control Flow Graph (CFG), a Data Flow Graph (DFG), a Control Data Flow Graph (CDFG), a program structure tree (PST), an abstract syntax tree (AST), a netlist, etc. A CDFG may capture the control flow as well as the data flow of the model through data dependency and control dependency edges. The IRs 140 may be stored in memory, such as the main memory, of a data processing device.

The cost calculation engine 128 may determine an execution cost value for the nodes of the graph or portion being analyzed, e.g., the nodes associated with the Feature Calculation subsystem 220. As noted, execution costs may be determined in a number of ways. They may be input to the concurrency engine 114, e.g., by the user. They may be determined through run-time profiling of the model or portion thereof on target hardware. Or, they may be estimated. If a cost was received by the concurrency engine 114, e.g., input by a user through one or more User Interfaces, the cost calculation engine 128 may utilize that received cost. For example, a user may specify execution cost values for one or more model elements of the Feature Calculation subsystem 220.

Alternatively or additionally, a profiler tool may be used to determine the execution costs of model elements of the Feature Calculation subsystem 220 during simulation, e.g., running, of the model. The profiler tool may calculate the time required to execute a model element, e.g., execution time per invocation of the model element on the target hardware. A suitable profiler tool is included in the Simulink® modeling environment, and is described in the documentation for the Simulink® modeling environment, such as the Simulink User's Guide (September 2018 edition). In addition to or alternatively from using a profiler tool, the model may be instrumented. For example, a model may be instrumented to capture timestamps associated with input and output signals to a model element. By subtracting the two timestamps, execution time of the block may be obtained.

The cost calculation engine 128 may analyze the IR, such as an IR having a form from which textual source code may be generated, such as C code, C++ code, FORTRAN code, etc. This IR, which may be referred to as a Code Generation Intermediate Representation (CGIR), may be created by applying one or more translations to the graph form of the IR. The textual source code may be compiled by a compiler to produce an executable. The cost calculation engine 128 may identify the portion, e.g., nodes and edges, of the CGIR that represents a given model element of the Feature Calculation subsystem 220. The cost calculation engine 128 may estimate costs for the nodes as a function of the unit or atomic operations performed by the node, dimensions of the data input and output from the node, the data type of the input and output, and the complexity (real or imaginary numbers). For example, the unit or atomic operations may be assigned cost values, the cost calculation engine 128 may count the number of operations included in a given node of the identified portion of the CGIR. In some embodiments, the cost calculation engine 128 may consider other factors, such as parameters and/or operation model of the model element represented by the node(s).

If no cost was input for a given model element, the cost calculation engine 128 may compute an execution cost value for the respective node or apply a default value.

FIG. 5 is a schematic illustration of an example of the execution costs store 130 in accordance with one or more embodiments. The execution costs store 130 may be arranged at least logically as a table having rows and columns defining cells or records for storing information. The execution costs store 130 may include a model element name column 502 and an execution costs column 504. It may also include a plurality of rows, such as rows 506*a-i*. Each row 506 of the store 130 may correspond to a particular model element included in the model or portion thereof being analyzed, e.g., the Feature Calculation subsystem 220. Row 506*a* may correspond to the Inport block 402 of the Feature Calculation subsystem 220 whose execution cost is determined to be 10 microseconds (ms). Row 506*b* may correspond to the Constant block 404 of the Feature Calculation subsystem 220 whose execution cost is determined to be 10 ms. Row 506*c* may correspond to the Color Space Conversion block whose execution cost is determined to be 40 ms. Row 506*d* may correspond to the MATLAB Function block 408 whose executions cost is determined to be 36 ms. Row 506*e* may correspond to the Blk2 Subsystem block 410 whose execution cost is determined to be 430 ms. Row 506*f* may correspond to the Create Scanlines Subsystem block 412 whose execution cost is determined to be 568. Row 506*g* may correspond to the Draw Lines Subsystem block 414 whose execution cost is determined to be 439 ms. Rows 506*h* and 506*i* may correspond to the two Outport blocks 416 and 418 whose execution costs are determined to be 10 ms.

It should be understood that different instances of a given type of model element, such as an Absolute (Abs) model element, may have different execution costs depending, for example, on the target hardware used to execute a particular instance of the Abs model element and/or on characteristics of the model in which a particular instance of the Abs block is included. Accordingly, an execution costs store with associated costs may be generated for each model being analyzed and/or for each target hardware intended to execute a given model.

Other data structures besides one or more tables may be used to store execution costs.

The cost calculation engine 128 may calculate the total execution cost of the disjoint subgraphs. For example, the cost calculation engine 128 may calculate the total execution cost of a given disjoint subgraph by summing the execution costs of each individual node included in the given disjoint subgraph.

The model analyzer 124 may parse the graph, e.g., the DFG, and identify one or more disjoint subgraphs within the graph. A disjoint subgraph may be a subset of connected nodes of the DFG that has no edges to another subgraph of connected nodes, e.g., to another subgraph. The model analyzer 124 may identify and/or designate the one or more disjoint subgraphs for concurrent execution, as the disjoint subgraphs do not have any data dependencies between them. The model analyzer 124 may also allocate the disjoint subgraphs to processing cores, for example based on execution costs associated with the disjoint subgraphs. When analyzing the entire model 200, the model analyzer 124 may parse the DFG associated with the entire model 200. When analyzing a portion of the model, such as the Feature Calculation subsystem 220, the model analyzer 124 may parse the portion of the DFG associated with that model portion.

In some embodiments, the model analyzer 124 may allocate the model elements associated with the disjoint subgraphs to processing cores for concurrent execution. The allocation of model elements to processing cores may be determined as a function of the computed execution costs of the disjoint subgraphs, for example to achieve load balancing among the processing cores. In some embodiments, the model analyzer 124 may apply a round robin allocation approach. For example, the model analyzer 124 may allocate the model elements associated with the disjoint subgraph having the highest computed cost to one processing core, the model elements associated with the disjoint subgraph having the next highest computed cost to another processing core, the model elements associated with the disjoint subgraph having the third highest computed cost to yet another processing core, and so on until the model elements for at least one disjoint subgraph functionality have been allocated to all available processing cores. The allocation of model elements associated with disjoint subgraphs may then resume with the first or initial processing core to which the model elements associated with disjoint subgraph having the highest computed cost was allocated.

In other embodiments, the model analyzer 124 may compare the execution costs computed for the disjoint subgraphs and allocate them by balancing the execution costs across the processing cores. As an example, suppose there are two processing cores and four disjoint subgraphs whose computed costs are: 20, 10, 5, and 3. In this example, the model analyzer 124 may allocate the model elements associated with the first disjoint subgraph (having an execution cost of 20) to a first processing core, while allocating the model elements associated with all of the other disjoint subgraphs (having execution costs of 10, 5, and 3 for a total of 18) to a second processing core to keep the cores balanced.

In some embodiments, the model analyzer 124 may parse a DFG and identify disjoint subgraphs first and then the cost calculation engine 128 may determine execution costs associated with the nodes of the DFG.

The model analyzer 124 may allocate the model element associated with a disjoint subgraph to a given processing core by mapping the functionality represented by the model element to a task and then assigning the task to the given processing core for execution. The model analyzer 124 may assign tasks to processing cores by modifying the IR to include information indicating the assignment. In some embodiments, the code generator 108 implements the assignment, for example by using the Open Multi-Processing (OpenMP) standard from the OpenMP Architecture Review Board and/or the Thread Building Blocks (TBB) standard from Intel Corp. OpenMP is an Application Programming Interface (API) that defines a set of compiler directives, library routines, and environment variables that, when added to a C, C++, or Fortran program, support execution of the program in parallel on a shared memory, multiprocessor computer system. TBB includes a C++ library that manages and schedules threads to execute tasks in parallel.

The model analyzer 124 may identify existing concurrency in a model or portion thereof in other and/or additional ways. Specifically, the model analyzer 124 may search the DFG for nodes associated with specific types of model elements that, by definition, run concurrently. For example, the Simulink® simulation environment includes a For Each type of subsystem. A For Each subsystem repeats execution of the functionality defined for the For Each subsystem at each time step on each element or subarray of an input signal to the For Each subsystem, and may concatenate the individual results into an output signal. A set of interconnected blocks within the For Each subsystem defines the functionality applied to each element (or subarray) of the input signal.

The model analyzer 124 may search the DFG (or portion thereof) for nodes associated with For Each subsystems. For a given node associated with a For Each subsystem, the model analyzer 124 may determine the execution costs of the model elements associated with the nodes contained in the given node associated with the For Each subsystem. The model analyzer 124 may determine whether the total execution costs exceed the overhead of having a new thread. The overhead associated with a thread may include the execution costs involved in creating, scheduling, and closing or tearing down a thread. If the execution costs of the model elements contained in the For Each subsystem exceed the overhead of having a new thread, the model analyzer 124 may determine the number of iterations performed by the For Each subsystem. The model analyzer 124 may allocate each iteration to a respective processing core for concurrent execution. Again, the model analyzer 124 may use a round robin or other assignment technique and the code generator 108 may utilize OpenMP and/or TBB.

In addition to For Each subsystems another parallel structure that may be provided by some programming environments are Parallel For-Loops. For example, the MAT-LAB® language/programming environment includes a parallel for-loop structure called a parfor-loop. The syntax of the parfor-loop in MATLAB is parfor loopVar=initVal:endVal; statements; end
where,
parfor marks the beginning of the parallel for-loop,
loopVar is the loop index, specifying a vector of integers increasing by 1 between initVal and endVal, and
statements are the loop body commands, and
end marks the end of the parallel for-loop.

The model analyzer 124 may determine whether the model or portion thereof being analyzed for existing concurrency includes any parfor-loops. For example, some modeling environments include model element types that run code written in a textual language. These model elements may be referred to as code blocks. The Simulink® simulation environment includes a MATLAB Function block type that calls a function written in the MATLAB® language from within a simulation model and a MATLAB System block type that incorporates system objects within a simulation model. The LabVIEW programming system includes a Call Library Function Node that calls a Dynamic Link Library (DLL) or shared library function from within a LabVIEW block diagram.

The model analyzer 124 may search the DFG (or portion thereof) for nodes associated with code blocks. For a given node associated with a code block, the model analyzer 124 may access the associated textual code. For example, a code block may include a pointer to a file, object, or other data structure containing the textual, e.g., MATLAB, code implemented by the code block. The model analyzer 124 may access this pointer to locate the data structure. The model analyzer 124 may analyze the code, and determine whether the textual code includes a parfor-loop. The model analyzer 124 may determine the execution costs of the statements included in the par-for loop through user input of execution costs, profiling on target hardware, and/or IR estimation. The model analyzer 124 may determine whether the total execution costs of the statements included in the parfor-loop exceed the overhead of having a new thread. If the execution costs of the statements exceed the overhead of having a new thread, the model analyzer 124 may determine the number of iterations performed by the parfor-loop. The model analyzer 124 may allocate each iteration or subsets of iterations to a respective processing core for concurrent execution.

As a result of the analysis, the model analyzer 124 may determine that the Feature Calculation subsystem 220, as currently configured, can be run concurrently by two processing cores. For example, the model analyzer 124 may determine that the DFG for the Feature Calculation subsystem 220 includes two disjoint subgraphs.

The model analyzer 124 may also analyze the model 200 or a portion thereof, such as the Feature Calculation subsystem 220, to determine whether there is an opportunity for additional concurrency during execution.

The model analyzer 124 may determine whether opportunities for additional concurrency exist by increasing latency and pipelining the model 200 or a portion thereof. The model analyzer 124 may determine whether the latency budget for the Feature Calculation subsystem 220 is greater than zero. If the latency budget is greater than zero, the model analyzer 124 may analyze the portion of the DFG associated with the Feature Calculation subsystem 220 and identify the critical path of that portion of the DFG. The critical path may refer to the set of interconnected nodes of the portion of the DFG associated with the Feature Calculation subsystem 220 that are the most expensive in terms of execution cost as compared to other sets of interconnected nodes. The model analyzer 124 may also determine a point along the critical path at which the nodes before or after the point have at least roughly equal execution cost as the nodes after or before the point, respectively. In other words, the model analyzer 124 may determine a midpoint along the critical path. The modification generator 126 may create a proposed modification that splits the critical path into two substantially balanced sub-paths by inserting a pipeline stage at the point identified by the model analyzer 124, e.g., at the midpoint.

For example, suppose the model analyzer 124 identifies the critical path as being the following set of interconnected nodes:

Node1 (execution cost 40)→Node2 (execution cost 20→Node3 (execution cost 10)

The total execution cost of the critical path is 70. The model analyzer 124 may identify the break point as being between Node1 and Node2 as the execution cost before that point, i.e., 40, is roughly equal to the execution cost after that point, i.e., 30. The pipelining engine 150 of the modification generator 126 may insert a pipeline stage at this point, i.e., between Node1 and Node2.

The pipeline stage may be a delay that breaks the data dependency along the critical path and creates two subpaths. While the model elements of the critical path may have been associated with a single disjoint subgraph, the addition of the pipeline stage results in the model elements being associated with two distinct disjoint subgraphs.

A delay may hold data from one thread before exchanging the data with another thread. A delay may be specified in the form, $Z^{-k}$, where k is the number of simulation time steps of delay. In some embodiments, a delay may be implemented in a model through a delay block, such as the Delay block of the Simulink® simulation environment. A Delay block outputs the input of the block after a delay based on the value of the block's 'Delay length' parameter.

Following the insertion of the pipeline stage, the delay compensator 152 may perform delay balancing on the DFG to ensure numerical correctness of the model as modified. More specifically, the delay compensator 152 may determine whether any additional delays need to be added to the DFG so data is exchanged between nodes and/or subgraphs at the expected simulation time step. For example, suppose Node1 of the above example has another output edge connected to another node, e.g., Node4. The delay compensator 152 may also add a pipeline stage, e.g., a delay, between Node1 and Node4.

This process of identifying the critical path, breaking the critical path into subpaths by inserting a pipeline stage, and balancing the introduced delay may be repeated until the latency budget for the Feature Calculation subsystem 220 is met, or there is no path within the Feature Calculation subsystem 220 that could benefit from being split. For example, if the execution cost of the critical path to be split is less than the execution cost of at least one of the two subpaths being proposed, then the pipelining engine 150 may reject breaking the critical path.

Suppose the modification generator 126 determines that, by adding latency and pipelining, the model elements of the Feature Calculation subsystem 220 can be assigned to three processing cores for concurrent execution. The modification generator 126 may create a proposed modification for the Feature Calculation subsystem 220. The proposed modification may include increasing latency and pipelining. In some embodiments, the concurrency engine 114 may direct the UI engine 102 to present one or more graphical affordances on or in relation to the model 200 to indicate existing concurrency and/or the opportunities for increasing concurrency determined by the model analyzer 124 and the modification generator 126.

Figure 6:
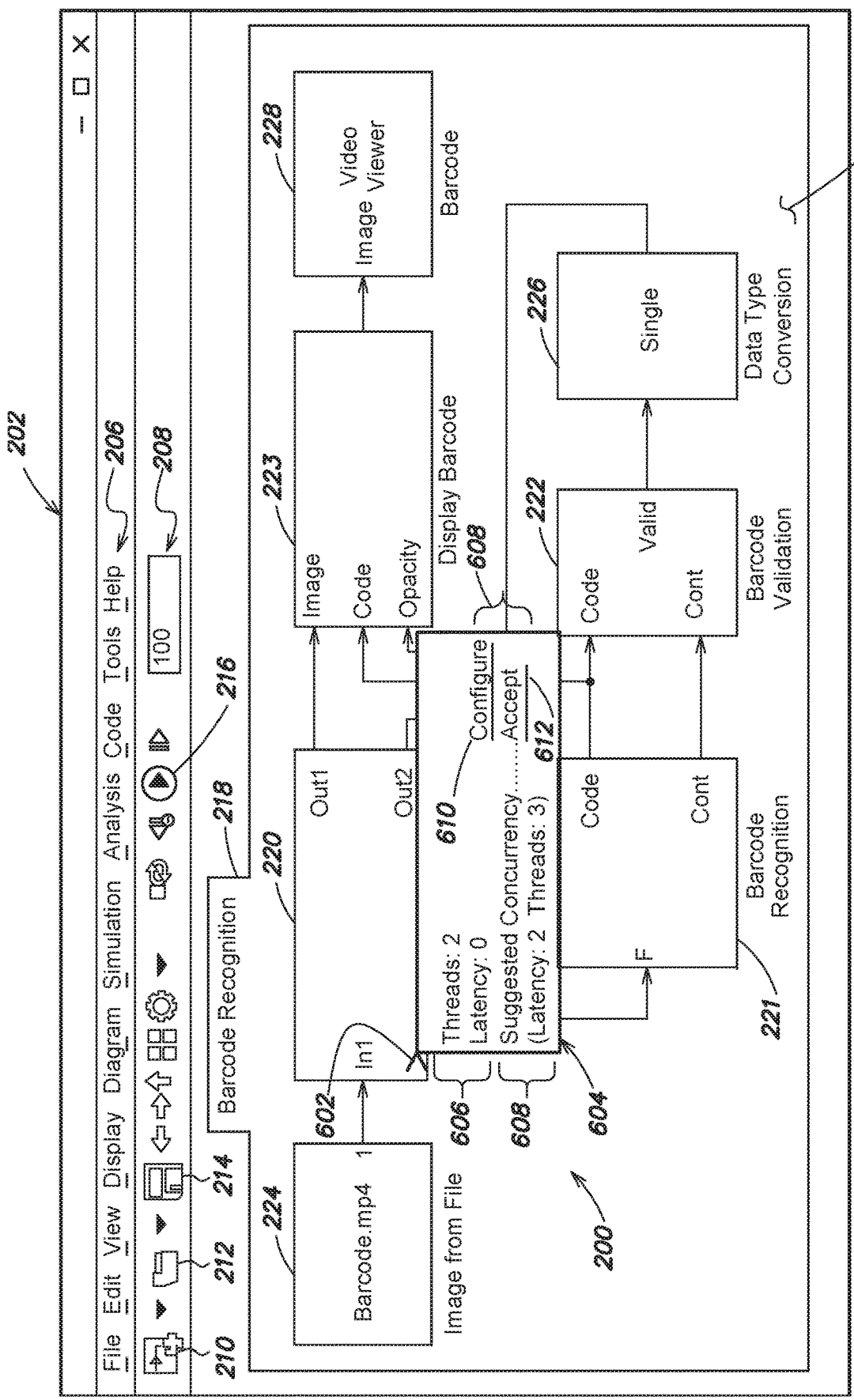
FIG. 6 is an illustration of an example simulation model in accordance with one or more embodiments.

FIG. 6 is another illustration of the example simulation model 200 in accordance with one or more embodiments. The UI engine 102 may add one or more graphical affordances, such as graphical affordance 602, to the model 200. The UI engine 102 may place the graphical affordance 602, which may also be referred to as a decoration, on or near the Feature Calculation subsystem 220 to indicate that the decoration 602 is associated with the Feature Calculation subsystem 220. The decoration 602 may be in the form of a right pointing arrowhead as shown, although it may take other forms, such as symbols, icons, pictures, letters, words, etc. Furthermore, the UI engine 102 may provide the decoration 602 with an appearance that indicates user attention is requested, such as a particular color, font, shadow style, animation, or other effect. For example, the arrowhead may be a solid color.

In response to user input, such as selection of the decoration 602, the concurrency engine 114 may present concurrency information computed for the respective component, e.g., the Feature Calculation subsystem 220. The user input may be a mouse click of the decoration 602, although other user input operations may be used. The UI engine 102 may present the concurrency information in a popup window 604. The popup window 604 may include one area 606 that presents information on the subsystem's existing concurrency, and another area 608 that presents information on one or more opportunities for creating additional concurrency when running the subsystem.

The area 606 may provide information on the existing concurrency determined for the Feature Calculation subsystem 220. For example, the area 606 may indicate the number of threads that are being used to execute the Feature Calculation subsystem, e.g., two. The area 606 may also indicate the latency of the Feature Calculation subsystem, e.g., zero. The model execution engine 112 may determine the number of threads and the latency, e.g., when compiling the model 200. For example, the Blk2 subsystem block 410 and the Draw Lines subsystem block 414 may be run in one thread, and the Constant block 404, the Color Space Conversion block 406, the MATLAB function block 408, and the Create Scanlines subsystem block 412 may be run in another thread. In some embodiments, the UI engine 102 may present one or more graphical affordances that inform the user of the model elements running in the two threads. For example, the UI engine 102 may color code the model elements and components of the Feature Calculation subsystem 220 to indicate which model elements and components are being run by which of the two threads. The UI engine 102 may also present a legend, e.g., in the form of a popup window, that associates the chosen colors to the respective threads.

The area 608 of the popup window 604 may provide information on additional concurrency that may be achieved by modifying the Feature Calculation subsystem 220. For example, the area 608 may indicate the number of threads, e.g., three, and the latency, e.g., two, for the Feature Calculation subsystem 220, if a proposed modification is accepted.

It should be understood that the UI engine 102 may include additional, less, and/or other information in the popup window 604. For example, in some embodiments, the area 608 may present only latency and/or only the number of threads. The UI engine 102 may include two buttons 610 and 612 labeled 'Configure' and 'Accept' in the area 608.

In response to selection of the Configure button 610, e.g., through user input, the model execution engine 112 may establish three threads for executing the Feature Calculation subsystem 220, and may assign the model elements and components of the Feature Calculation subsystem 220 to these three threads. The UI engine 102 may use one or more graphical affordances to inform the user of the assignment of blocks to the three threads of the proposed modification.

Figure 7:
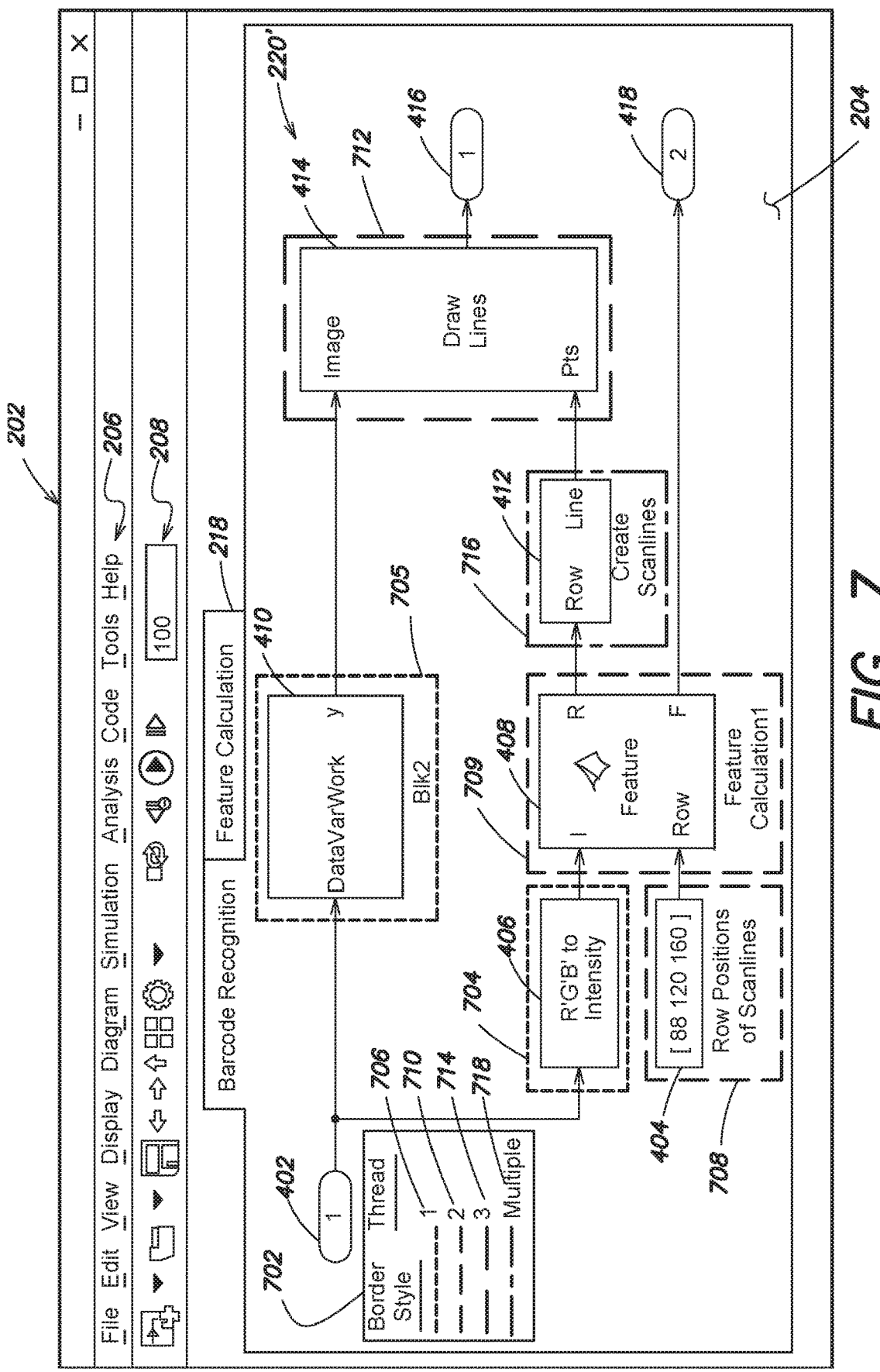
FIG. 7 is an example of a revised version of a subsystem in accordance with one or more embodiments.

FIG. 7 is an example of a modified version of the Feature Calculation subsystem as indicated at 220' in accordance with one or more embodiments. The UI engine 102 may create the modified Feature Calculation subsystem 220' by adding graphical affordances that indicate which blocks are being run by the different threads. For example, the UI engine 102 may place or overlay borders around the blocks and apply different line styles to those borders, where the different line styles correspond to respective threads. The UI engine 102 may also include a legend 702 that associates the line styles to the threads. As illustrated, the UI engine 102 may use borders 704 and 705 having a dotted line style to indicate that the Color Space Conversion block 406 and the Blk2 subsystem block 410 are run by one thread identified as 'Thread 1' in an entry 706 of the legend 702. The UI engine 102 may use borders 708 and 709 having a short dash style to indicate that the Constant block 404 and the MATLAB function block 408 are run by another thread identified as 'Thread 2' in another entry 710 of the legend 702. The UI engine 102 may use a border 712 having a long dash style to indicate that the Draw Lines subsystem block 414 is run by yet another thread identified as 'Thread 3' in a further entry 714 of the legend 702. The UI engine 102 may use a border 716 having a dot-dash line style to indicate that the blocks included in the Create Scanlines subsystem block 412, which represents a virtual subsystem, are run by more than one of the three threads as indicated by the additional entry 718 named 'Multiple' of the legend 702.

In response to UI events triggered by user input opening the Create Scanlines subsystem block 412, the UI engine 102 may present the blocks that make up the Create Scanlines subsystem block 412, and may include borders whose line styles indicate which of the three threads are running those blocks.

In response to user input accepting the proposed modification, e.g., by the user selecting the Accept button 612, the concurrency engine 114 may save the suggested modification to the model 200.

In addition, the UI engine 102 may close the popup window 604, and may alter the appearance of the decoration 602 to indicate that user input is no longer requested and/or no longer possible.

Figure 8:
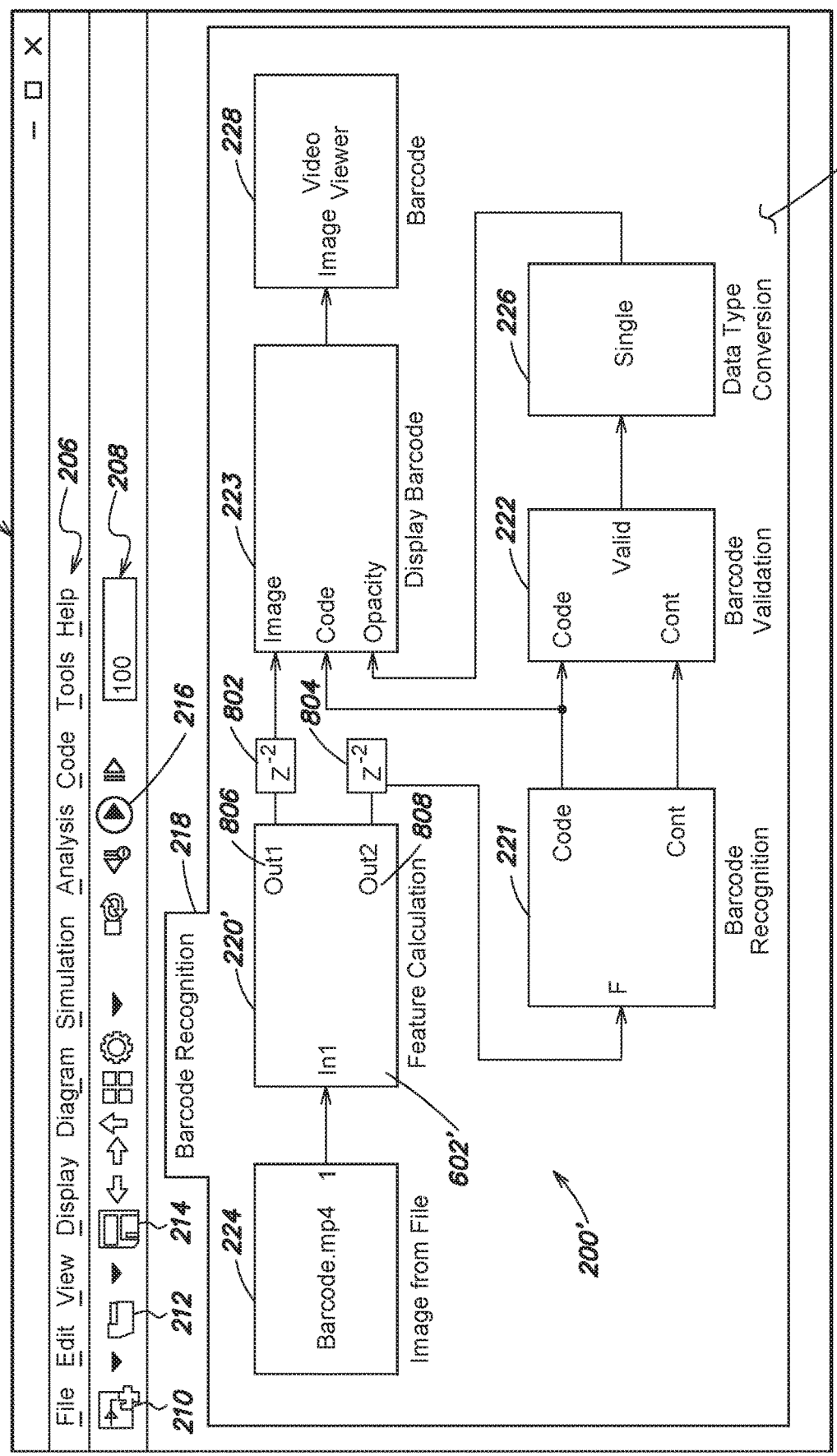
FIG. 8 is an illustration of an example of a modified version of a simulation model in accordance with one or more embodiments.

FIG. 8 is an illustration of a modified version of the simulation model as indicated at 200' in accordance with one or more embodiments. The UI engine 102 may modify the appearance of the decoration as indicated at 602' to indicate that user attention is no longer requested. For example, the UI engine 102 may change the arrowhead from a solid color to white or grayed out. In some embodiments, the UI engine 102 may add one or more graphical affordances to indicate that delays have been added as a result of the user accepting the proposed modification. For example, the UI engine 102 may add badges 802 and 804 indicating the addition of delays to the modified model 200'. More specifically, the Feature Calculation subsystem 220' may have two output ports 806 and 808 named 'Out1' and 'Out2'. The badges 802 and 804 may be located on or near the output ports 806 and 808 of the Feature Calculation subsystem 220' to indicate that delays of two sample times have been added to the output ports 806 and 808.

The UI engine 102 may open the revised Feature Calculation subsystem 220', e.g., in response to user input, and provide a visual presentation indicating where the concurrency engine 114 added the delays, for example in response to user input, such as selection of the revised decoration 602'.

Figure 9:
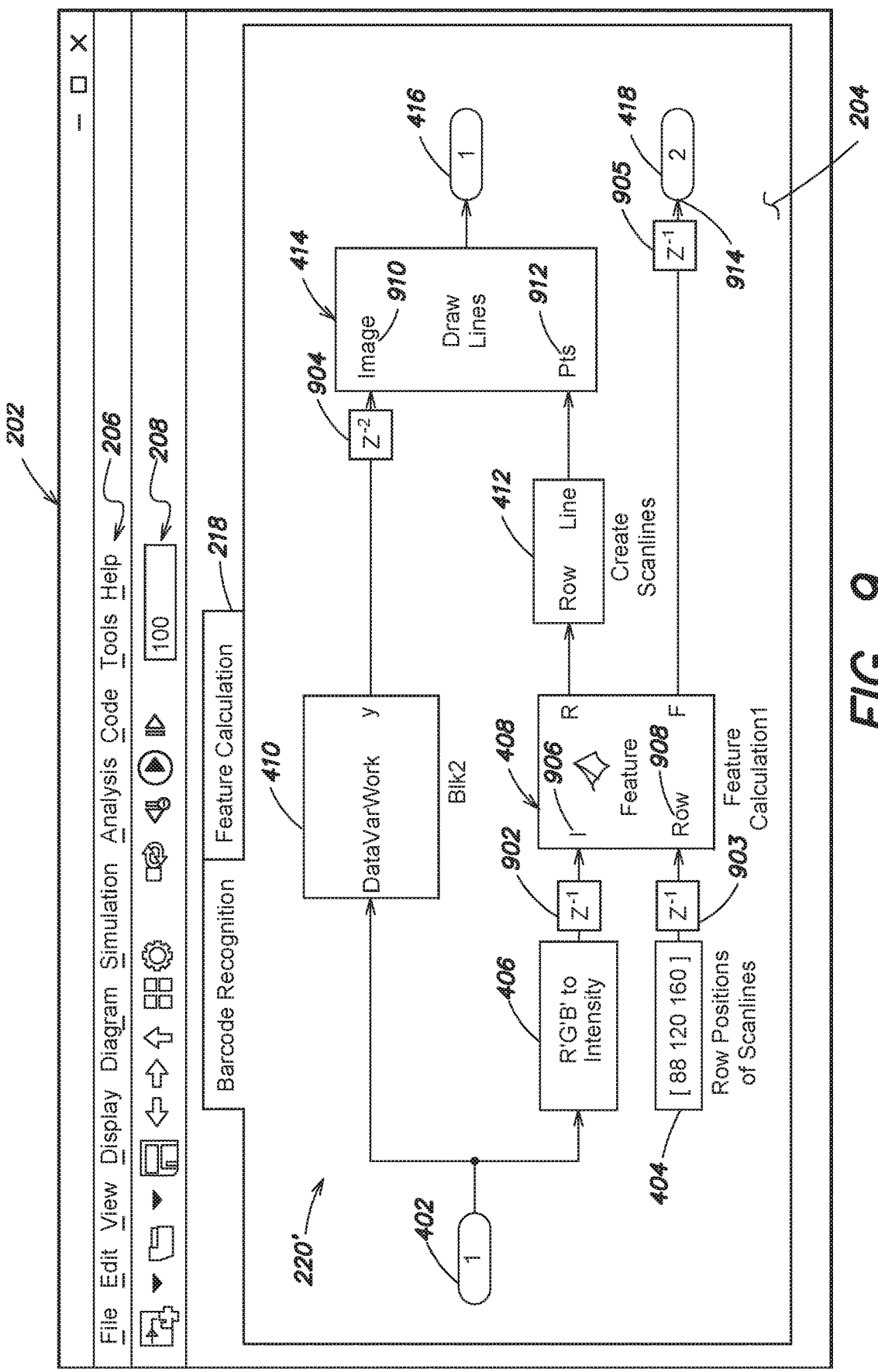
FIG. 9 is an illustration of an example of a modified version of a subsystem in accordance with one or more embodiments.

FIG. 9 is an illustration of the modified version of the Feature Calculation subsystem 220' in accordance with one or more embodiments. The UI engine 102 may add one or more graphical affordances to the modified Feature Calculation subsystem 220' to provide a visual indication to the user regarding the addition of delays as well as their locations. FIG. 9 may provide a finer level of granularity or detail regarding the addition and location of delays than FIG. 8. For example, the UI 102 engine may add badges 902-905 indicating the addition of delays to the modified Feature Calculation subsystem 220'. More specifically, the Feature Calculation1 subsystem 408 may have two input ports 906 and 908 named 'I' and 'Row', respectively. The badges 902 and 903 may be located on or near the input ports 906 and 908 of the Feature Calculation1 subsystem block 408 to indicate that delays of one sample time have been added to the input ports 906 and 908. The Draw Lines subsystem 414 may have two input ports 910 and 912 named 'Image' and 'Ns', respectively. The UI engine 102 may locate the badge 904 on or near the input port 910 of the Draw Lines subsystem block 414 to indicate that a delay of two sample times has been added to the input port 910. The Outport block 2 418 may have an input port 914. The UI engine 102 may locate the badge 905 on or near the input port 914 of the Outport block 418 to indicate that a delay of one sample time has been added to the input port 914.

The badges 902-904 may indicate the addition of pipeline stages to increase concurrency. The badge 905 may indicate the addition of a delay to compensate or balance the delays introduced by the pipeline stages. Because the Outport block 1 416 produces the first numerical answer after 2 delays due to the $z^{-2}$ delay at the inputs of the Draw Lines subsystem block 414, the second Outport block 2 418 needs to also produce the first numerical answer after two delays for numerical correctness and/or to maintain alignment in time of the system. But on the path connecting the Inport block 402 to the Outport block 2 418 there has been inserted only one pipeline delay, which is at the input ports of the Feature Calculation 1 subsystem block 408, as indicated by the badges 902 and 903. Therefore, to keep the two outputs of the modified Feature Calculation subsystem 220' aligned time-wise, the delay compensator 152 inserts another delay before the Outport block 2 418, as indicated by the badge 905.

When determining whether to suggest a modification to further partition a portion of the model 200 to increase concurrency, the concurrency engine 114 may determine whether the execution overhead associated with creating a new thread is greater than the total execution cost, e.g., total execution time, of the model elements that would be assigned to the new thread. Suppose, for example, that the execution time of two model elements is two nanoseconds, but the overhead, e.g., thread creation and context switching, is 40 nanoseconds. In this case, it would be better to not create a separate thread of execution for those two model elements, as it takes longer to run because of thread management than running the two model elements in the same thread with other model elements. That is, while threads are considered to be lightweight in terms of execution time required to create and schedule threads when compared to processes, there is still overhead associated with running a thread. As noted, the overhead associated with a thread may include the execution time involved in creating, scheduling, and closing or tearing down the thread. Scheduling may include scheduling resources, such as processor cores, needed by the thread, and scheduling the thread for execution, e.g., in relation to other threads, such as placing one thread in a wait state to put another thread in a run state allowing it to start or resume execution, which may involve storing the current state of the thread being paused, and retrieving the current state of the thread starting or resuming execution.

Figure 10:
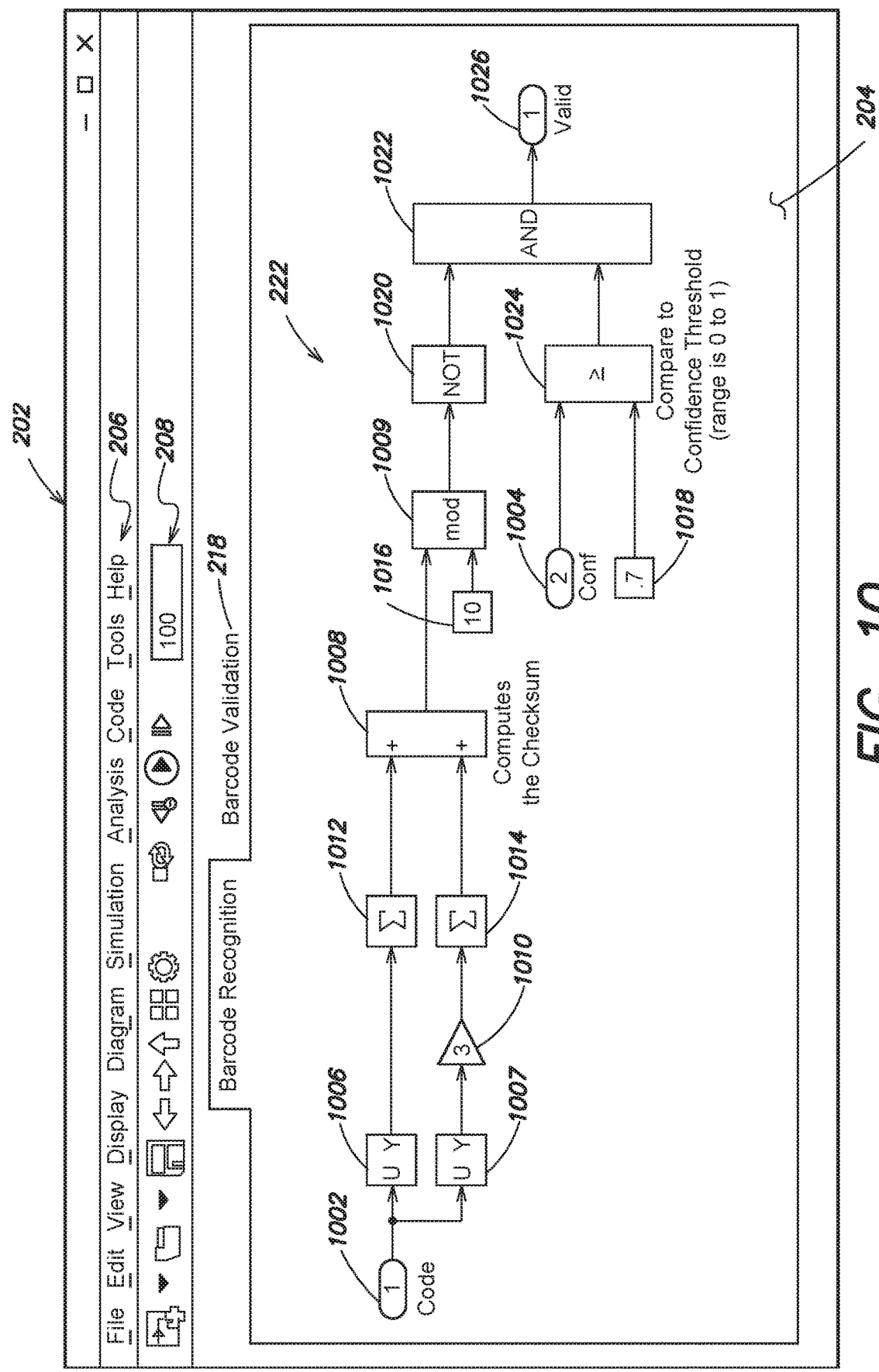
FIG. 10 is an illustration of an example subsystem in accordance with one or more embodiments.

FIG. 10 is an illustration of the model elements contained in the Barcode Validation subsystem 222 in accordance with one or more embodiments. FIG. 10 illustrates the impact of overhead when considering existing concurrency or opportunities for additional concurrency. The Barcode Validation subsystem 222 may include two Inport blocks 1002 and 1004 named 'Code' and 'Conf', four subsystem blocks 1006-1009, a Gain block 1010, two Sum blocks 1012 and 1014, two Constant blocks 1016 and 1018, two Boolean operator blocks 1020 and 1022, a Relational Operator block 1024, and an Outport block 1026 named 'Valid'.

The model analyzer 124 may analyze the model 200 and/or the Barcode Validation subsystem 222 to determine existing concurrency of the Barcode Validation subsystem 222. The model analyzer 124 may determine that the portion of the DFG associated with the Barcode Validation subsystem 222 includes two disjoint subgraphs. For example, the model analyzer 124 may determine that the Inport block 1004, the Constant block 1018, and the Relational Operator block 1024 are included in one disjoint subgraph, while the other blocks (1002, 1006-1016, 1020, 1022, and 1026) of the Barcode Validation subsystem 222 are included in another disjoint subgraph. The cost calculation engine 128 may determine the execution costs of the Inport block 1004, the Constant block 1018, and the Relational Operator block 1024.

The cost calculation engine 128 may determine that the execution costs of the Inport block 1004, the Constant block 1018, and the Relational Operator block 1024 is less than the overhead for starting a new thread. For example, the model analyzer 124 may determine that the execution costs for blocks 1004, 1018, and 1024 is 60 (10+10+40) ms. The model analyzer 124 may compare the execution cost of the blocks included in the disjoint subgraph to be run in the proposed thread to the overhead for a new thread. The model analyzer 124 may contain or have access to one or more default or other values for the overhead costs of a thread. For example, the overhead cost may be input by the user as a constraint. An exemplary default value is 100 ms. Because the execution costs of the Inport block 1004, the Constant block 1018, and the Relational Operator block 1024 (60 ms) is less than the overhead costs of a thread (100 ms), the model analyzer 124 may determine that the Barcode Validation subsystem 222 should not be run concurrently.

The model analyzer 124 may use other techniques besides and/or in addition to adding latency and pipelining to suggest opportunities to increase concurrent execution of a model or portion thereof. The model analyzer 124 may identify one or more existing model elements or other programming structures in the model that can be replaced by other blocks or structures to increase concurrency.

The model analyzer 124 may examine the components, for example subsystems, included in a simulation model, and determine whether any of the components, e.g., subsystems, apply the same functionality or algorithm to more than one input signal. If so, the modification generator 126 may create a proposed modification that replaces the component applying the same functionality or algorithm to more than one input signal with a For Each subsystem, and running each occurrence of the functionality or algorithm implemented by the For Each subsystem by a separate thread. Before proposing the replacement of an existing component (or set of model elements) with a For Each subsystem, the model analyzer 124 may compare the execution costs of the model elements contained in the existing component to the overhead associated with a new thread. If the execution costs of the model elements contained in the existing component are less than the overhead associated with a new thread, the model analyzer 124 may reject replacing the existing component with a For Each subsystem.

The concurrency engine 114 may also identify code nodes included in a model. For each code node, the concurrency engine 114 may access the textual code implemented by the code node, and analyze that textual code. The model analyzer 124 may identify a for-loop in the textual code, and may determine whether the for-loop can be replaced by a parfor-loop. For example, the model analyzer 124 may determine whether all of the iterations of the for-loop are independent. If so, the modification generator 126 may create a proposed modification to replace the for-loop with a parfor-loop. The model analyzer 124 may also determine whether any of the iterations of the for-loop include a call to external code. If so, the model analyzer 124 may determine that it is unable to replace the for-loop with a parfor-loop. In some embodiments, the model analyzer 124 may direct the UI engine 102 to present a graphical affordance requesting user input. The graphical affordance may ask the user whether, despite the call to external code, the for-loop may safely be replaced with a parfor-loop. If the user responds affirmatively, the modification generator 126 may replace the for-loop with a parfor-loop.

Figure 11:
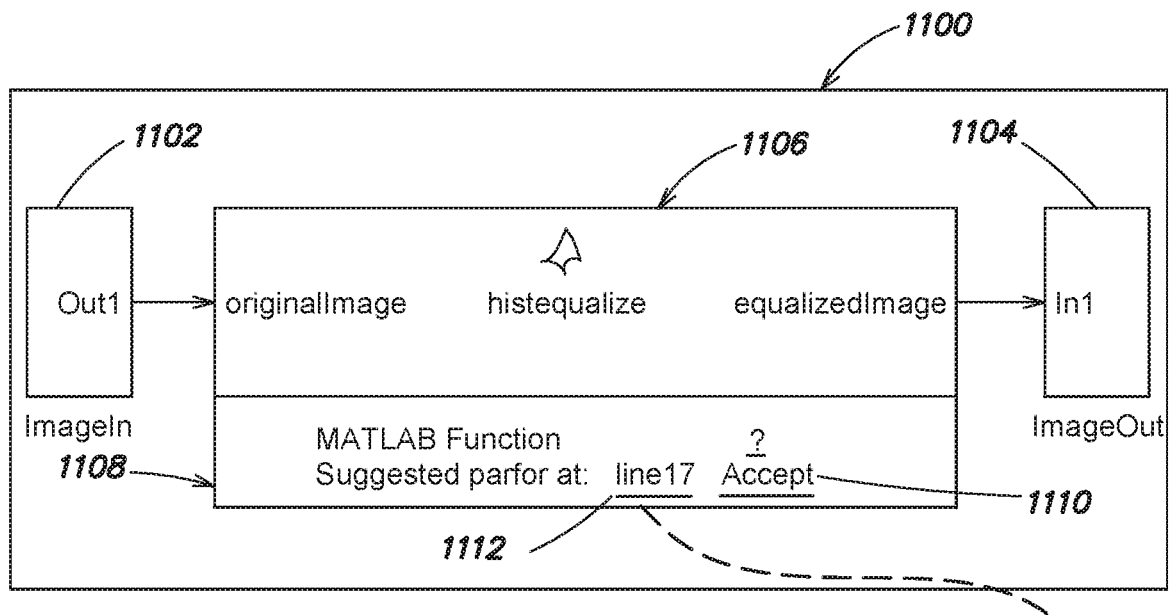
FIG. 11 is an illustration of an example simulation model in accordance with one or more embodiments.

FIG. 11 is an illustration of an example simulation model 1100 in accordance with one or more embodiments. The model 1100 may include two subsystems 1102 and 1104 named 'ImageIn' and 'ImageOut', and a MATLAB function block 1106 named 'histequalize'. The MATLAB function block 1106 may reference MATLAB code that applies a histogram equalization function to received images to produce output images having improved image contrast. The UI engine 102 may add a decoration to the MATLAB function block 1106 indicating that user attention is requested. In response to the user selecting the decoration (or another UI event), the UI engine 102 may present a popup window 1108 with information regarding the proposed modification. For example, the popup window 1108 may indicate that the proposed modification is to include a parfor-loop in the textual code. The popup window 1108 may also include a command button, such as the command button 1112 named 'line 17', in the popup window 1108 that links to the textual code implemented by the MATLAB function block 1106. In response to the user selecting the command button 1112 (or another UI event), the model editor 104 may open a code editor window 1114. The model editor 104 may present the source code implemented by the MATLAB function block 1106 in the code editor window 1114. In some embodiments, the command button 1112 may be in the form of a hyperlink, and the name of the command button 1112 may indicate where in the code the suggested change is to be made, e.g., line 17, as illustrated by dashed arrow 1116.

The modification generator 126 may generate replacement code that utilizes the parallel for-loop, e.g., a parfor-loop, in place of the for-loop. In some embodiments, the UI engine 102 may present this replacement code, for example in a popup window which may be separate from window 1108 or may be a part of window 1108. The UI engine 102 may further include a command button 1110 named 'Accept' in the popup window 1108. In response to the user selecting the command button 1110 (or another UI event), the modification generator 126 and/or the model execution engine 112 may modify the model 1100 to incorporate the proposed modification. For example the model execution engine 112 may replace the for-loop starting at line 17 with a parfor loop structure.

As noted, if the model analyzer 124 is unable to definitively determine that an existing for-loop may be safely replaced with a parfor-loop, it may direct the UI engine 102 to flag or mark the for-loop, e.g., using one or more graphical affordances, such as badges. The user may evaluate the flagged for-loop and indicate to the model analyzer 124 whether the for-loop can be replaced. If the model analyzer 124 receives approval, the modification generator 126 may replace the existing for-loop with a parfor-loop.

In addition to identifying model elements or programming structures that can be replaced by concurrently executing model elements or structures, the model analyzer 124 may also identify model elements or programming structures of a model or portion thereof that can be unfolded, e.g., replicated, to create additional concurrency.

Figure 12A:
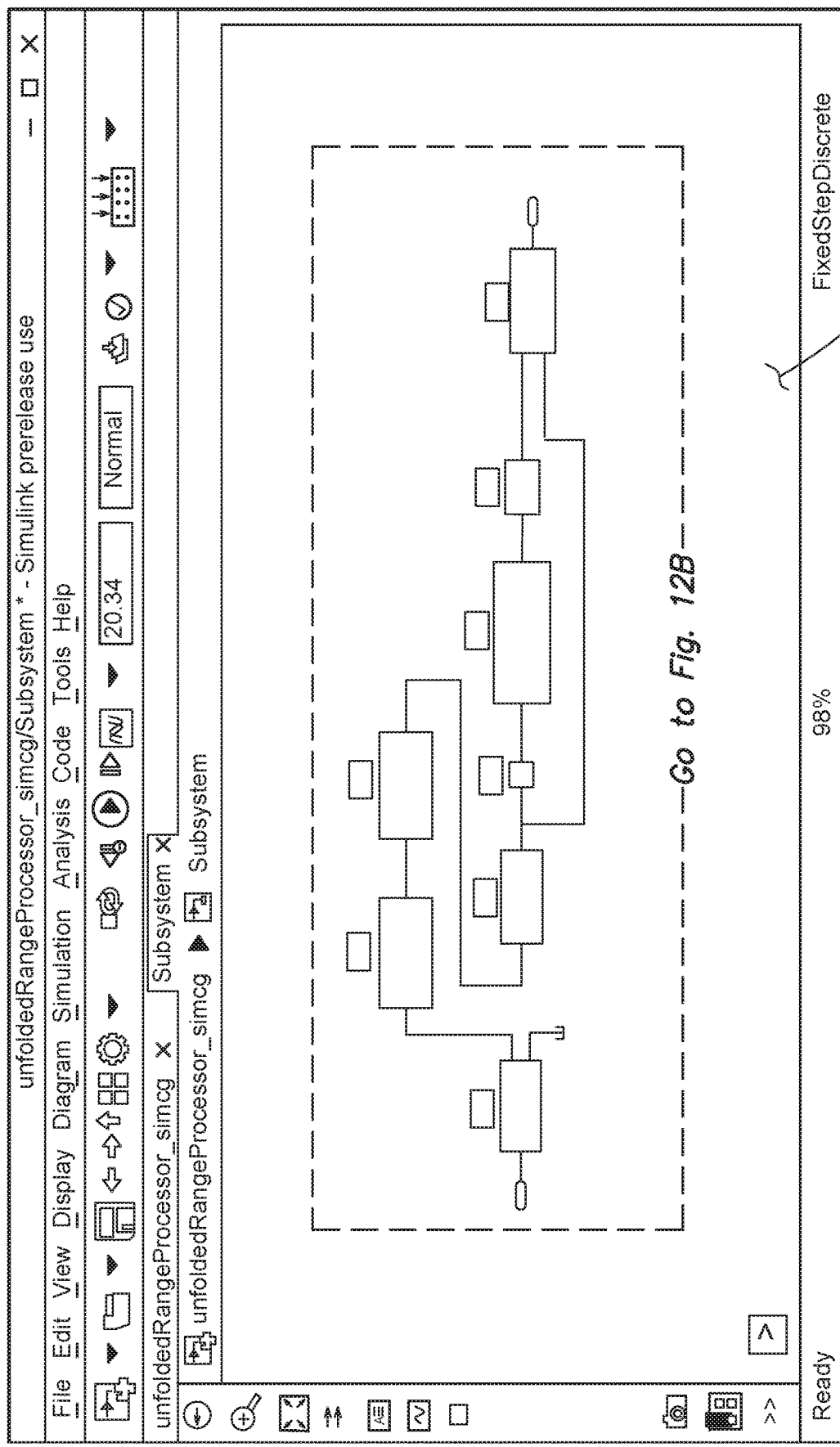
FIGS. 12A-C are partial views of an illustration of an example simulation model in accordance with one or more embodiments.
Figure 12B:
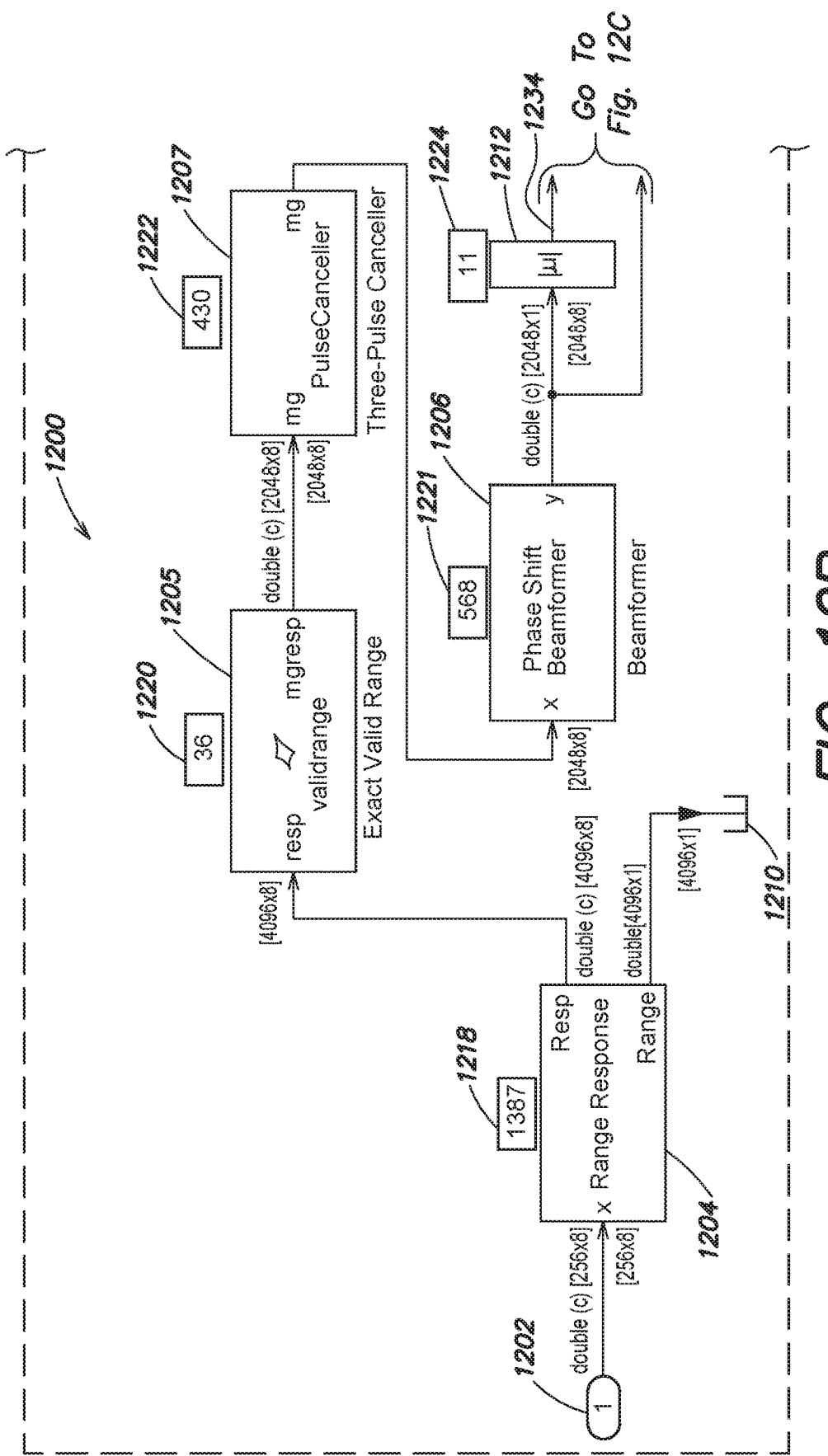
Figure 12C:
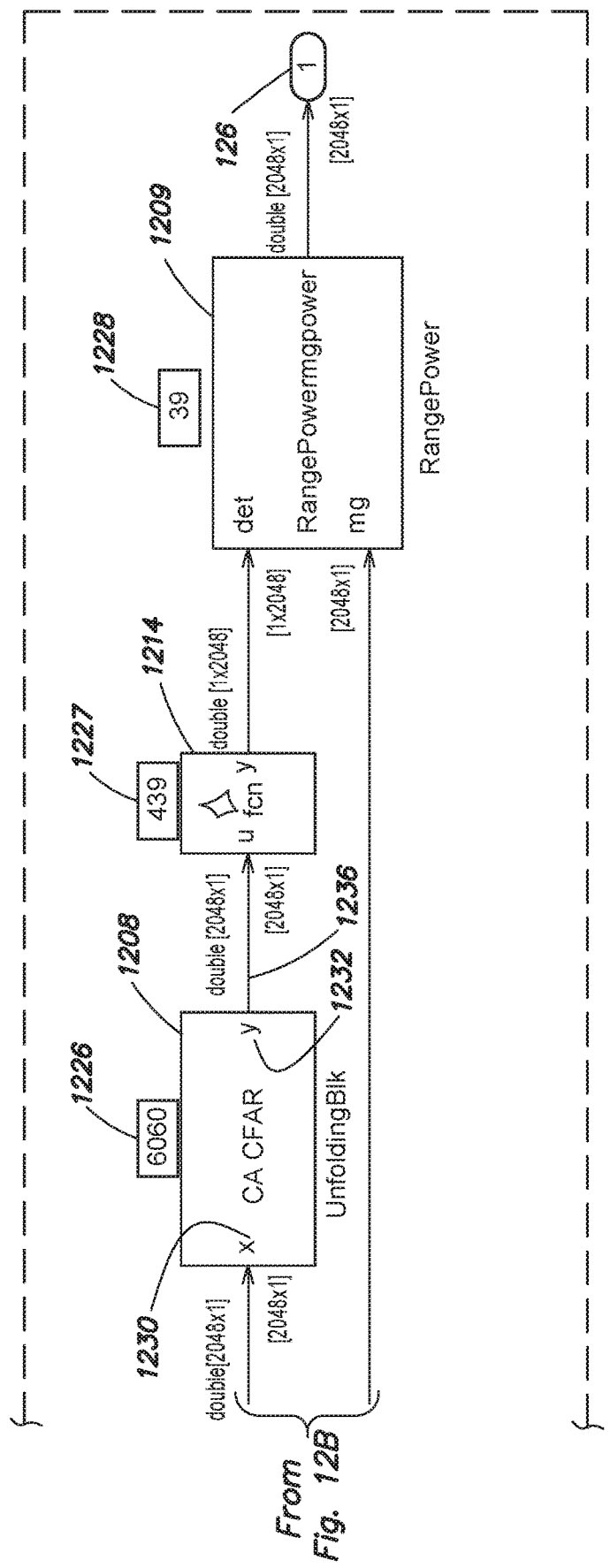

FIGS. 12A-C are partial views of an illustration of an example simulation model 1200 in accordance with one or more embodiments. The model 1200 may include an Inport block 1202, six subsystem blocks 1204-1209 labeled 'Range Response', 'Extract Valid Range', 'Beamformer', 'Three-Pulse Canceller', 'UnfoldingBlk', and 'Range Power', a Terminate block 1210, an Absolute block 1212, a MATLAB function block 1214, and an Outport block 1216. The cost calculation engine 128 may determine the execution costs of the blocks of the model 1200. The UI engine 102 may present the determined execution costs in one or more graphical affordances included in the simulation model 1200. For example, the UI engine 102 may present the execution costs in one or more badges associated with the blocks. A badge 1218 associated with the Range Response subsystem 1204 may indicate that its execution costs are 1387. Similarly, badges 1220-1222 associated with the Extract Valid Range subsystem 1205, the Beamformer subsystem 1206, and the Three Pulse Canceller subsystem 1207 may indicate that their execution costs are 36, 568, and 430, respectively. A badge 1224 associated with the Absolute block 1212 may indicate that its execution cost is 11. Badges 1226-1228 associated with the UnfoldingBlk subsystem 1208, the MATLAB function block 1214, and the Range Power subsystem 1209 may indicate that their execution costs are 6060, 439, and 39, respectively.

As illustrated, the execution cost of the UnfoldingBlk subsystem 1208, i.e., 6060, may be greater than the sum of execution costs of all the other blocks. In such cases, the model analyzer 124 may determine that using multithreading to achieve concurrency may be limited. In this case, the model analyzer 124 may evaluate whether concurrency may be increased by unfolding the UnfoldingBlk subsystem 1208 to increase the model's concurrency. The model analyzer 124 may determine the data dimensions of the signals at the input ports and output ports of the UnfoldingBlk subsystem 1208.

As described, the signals of a simulation model may have multiple attributes, such as data type, data dimension, numeric complexity, and sample time. Exemplary data types include unsigned integer (uint), single precision floating-point (single), and double precision floating-point (double), among others. Regarding data dimension, at least some of the blocks of a simulation model may output one-dimensional (1-D), two-dimensional (2-D), or multidimensional signals. A 1-D signal may be referred to as a vector, a 2-D or multidimensional signal may be referred to as a matrix, and a one-element array may be referred to as a scalar. In addition, a row vector may be a 2-D array having one row, and a column vector may be a 2-D array having one column. The UI engine 102 may be configured to display the attributes of the signals included in a model, such as the model 1200.

The UnfoldingBlk subsystem 1208 may include one input port 1230 labeled 'X', and one output port 1232 labeled 'Y'. A signal generated by the Absolute block 1212 and represented by signal arrow 1234 may be connected to the input port 1230, and another a signal 1236 generated by the UnfoldingBlk subsystem 1208 and represented by the signal arrow 1236 may be connected between the output port 1232 and the MATLAB function block 1214. The dimensions of the signals 1234 and 1236 at the input port 1230 and the output port 1232 may both be 2048×1, i.e., column vectors having 2048 elements.

The model analyzer 124 may evaluate the UnfoldingBlk subsystem 1208, and determine whether it may be unfolded, e.g., replicated, and whether each replication may operate on a subset of the input data of smaller dimensions. To make this determination, the model analyzer may identify the model element in the model or portion thereof being analyzed that has the highest execution cost (highestCost). The model analyzer 124 may compute the total execution cost (totalCost) of the model or portion thereof being analyzed. The model analyzer 124 may compute an execution cost ratio (costRatio) as highestCost/totalCost. The model analyzer 124 may determine whether the cost ratio (costRatio) exceeds a threshold, e.g., 70%. If not, the model analyzer 124 may reject the model element for unfolding. Assuming the cost ratio (costRatio) exceeds the threshold, the model analyzer 124 may compute an unfolding factor (unfoldingFactor), which indicates how many times the model element may be unfolded, e.g., replicated. The model analyzer 124 may compute the unfolding factor (unfoldingFactor) as follows:

$$\text{unfoldingFactor} = \text{costRatio} * \text{maxNumThreads},$$

where
maxNumThreads is the maximum number of threads, e.g., processing cores, of the target hardware on which the model or portion thereof is to be executed concurrently.

In some embodiments, the model analyzer 124 may analyze the model element having the next highest execution cost after the model element being considered for unfolding to ensure a performance bottleneck is not being created as a result of the unfolding. A performance bottleneck may occur when it takes significantly more time to execute one model element, e.g., block, than the other model elements. The one model element represents a dominant block for execution, and it may become a bottleneck because performance improvements may be limited to the execution time of this one model element. The model analyzer 124 may identify the model element that has the second highest execution cost (secondHighestCost). The model analyzer 124 may compute another execution cost ratio (execRatio) as highestCost/secondHighestCost. The model analyzer 124 may then compute a final unfolding factor (finalUnfoldingFactor) as follows:

$$\text{finalUnfoldingFactor} = \min(\text{unfoldingFactor}, \text{execRatio}).$$

Suppose, for example, that the execution cost of the UnfoldingBlk subsystem 1208 is 70 and the total execution cost of the model 1200 is 100. Suppose further that the target hardware includes six processing cores. The model analyzer 124 may compute the unfolding factor (unfoldingFactor) as $$\text{unfoldingFactor} = 70/100 * 6 = 4.2$$

The model analyzer 124 may thus determine that the UnfoldingBlk subsystem 1208 may be unfolded, e.g., replicated, four times, and each replication may operate on one-fourth of the input data, e.g., 512×1, which is a column vector having 512 elements.

The unfolding engine 154 may unfold the UnfoldingBlk subsystem 1208 to increase concurrency of the simulation model 1200.

Figure 13:
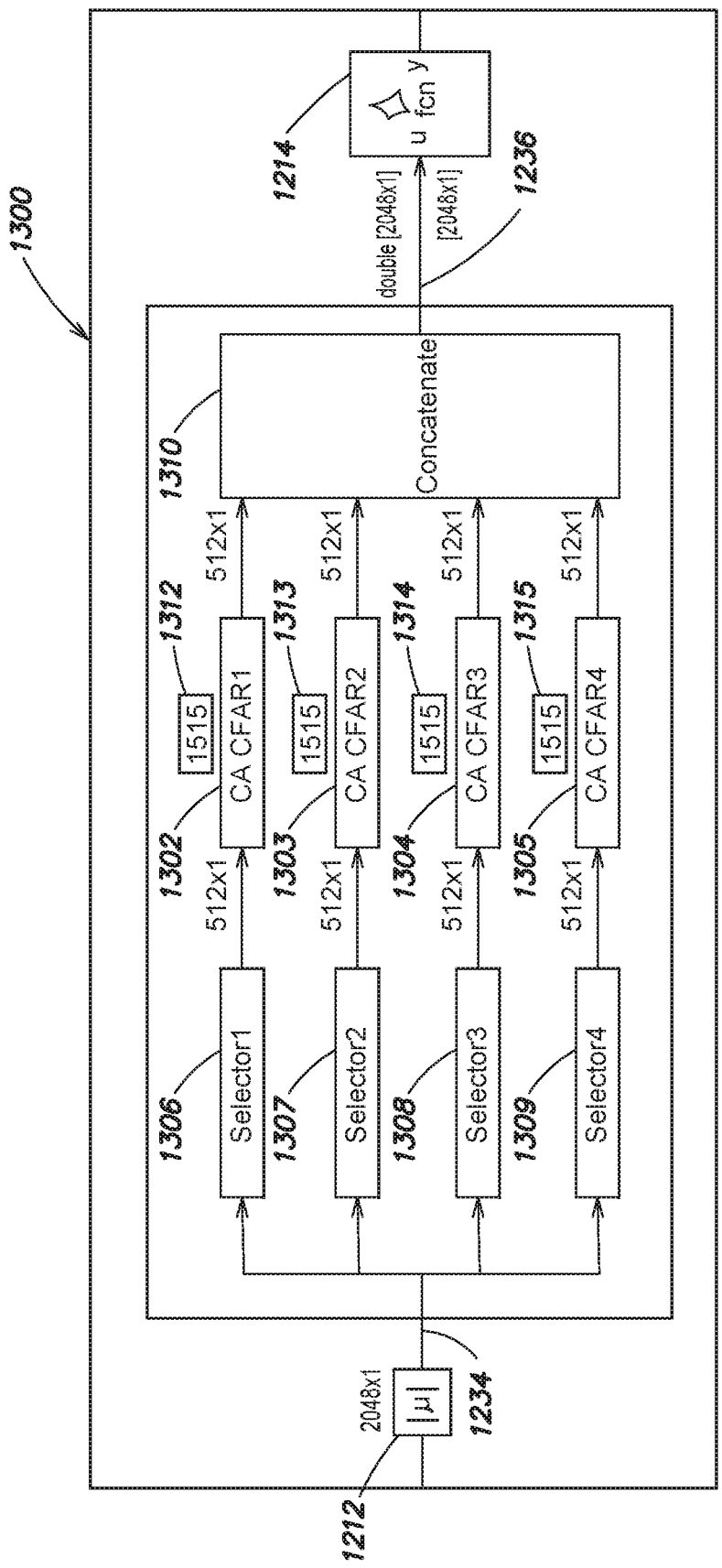
FIG. 13 is an illustration of an example unfolded version of a simulation model in accordance with one or more embodiments.

FIG. 13 is an illustration of an example unfolded version of the UnfoldingBlk subsystem indicated at 1300 in accordance with one or more embodiments. The unfolding engine 154 may create four replications 1302-1305 of the UnfoldingBlk subsystem 1208. The unfolding engine 154 may also include four Selector blocks 1306-1309, one for each of the four replications 1302-1305. The unfolding engine 154 may configure the Selector blocks 1306-1309 to select a set of data from the input signal 1234 to be input to a respective replication 1302-1305. The unfolding engine 154 may configure each Selector block 1306-1309 such that the set of data selected from the input data (whose data dimension is 2048×1) has a data dimension of 512×1. The unfolding engine 154 may configure each of the replications 1302-1305 to operate on input data of data dimension 512×1, thereby producing output data of data dimension 512×1. The unfolding engine 154 may further include a Concatenate block 1310, and the outputs of the four replications 1302-1305 may be connected to the Concatenate block 1310. The unfolding engine 154 may configure the Concatenate block 1310 to reconstruct the output signal 1236 (whose data dimension is 2048×1) from the outputs computed by the four replications 1302-1305 (whose data dimensions are 512×1). The modification generator 126 may connect an output of the Concatenate block 1310 to the MATLAB function block 1214. The unfolding engine 154 may also configure the unfolded version 1300 to run each replication 1302-1305 concurrently during execution of the model 1200.

The execution costs of each of the replications 1302-1305 may be 1515, e.g., one-fourth of the execution costs of the UnfoldingBlk subsystem 1208. The UI engine 102 may present graphical affordances, such as popup window 1312-1315, displaying the execution costs, e.g., 1515, of each of the four replications 1302-1305.

As noted, a group of model elements may be contained within a component, such as a subsystem, and components may contain other components, thereby establishing multiple hierarchical levels in a model. In some embodiments, the model analyzer 124 may search for opportunities for increasing concurrency across a model's hierarchical levels. For example, the model may be flattened and the model analyzer 124 may analyze the flattened model. Accordingly, opportunities for partitioning, pipelining, substitution, or unfolding may extend across a model's hierarchical levels.

The following flow diagrams are for illustrative purposes only. In some embodiments, one or more of the illustrated steps may be omitted, additional steps may be added, the order of the illustrated steps may be changed, one or more illustrated steps may be subdivided into multiple steps, multiple illustrated steps may be combined into a single step, and/or one or more of the flow diagrams may be separated into multiple, distinct flow diagrams.

Figure 14A:
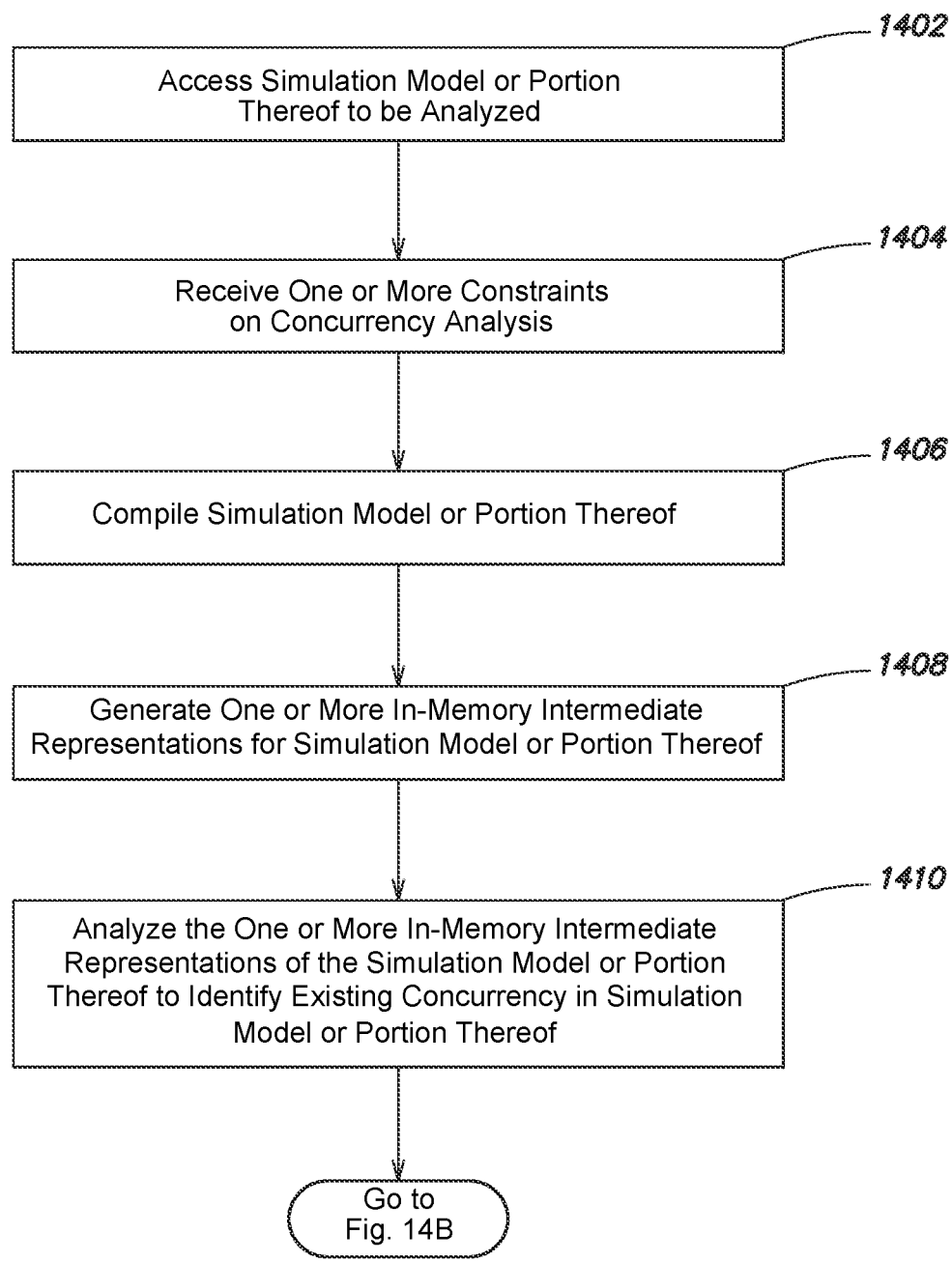
FIGS. 14A-C are partial views of a flow diagram an example method in accordance with one or more embodiments.
Figure 14B:
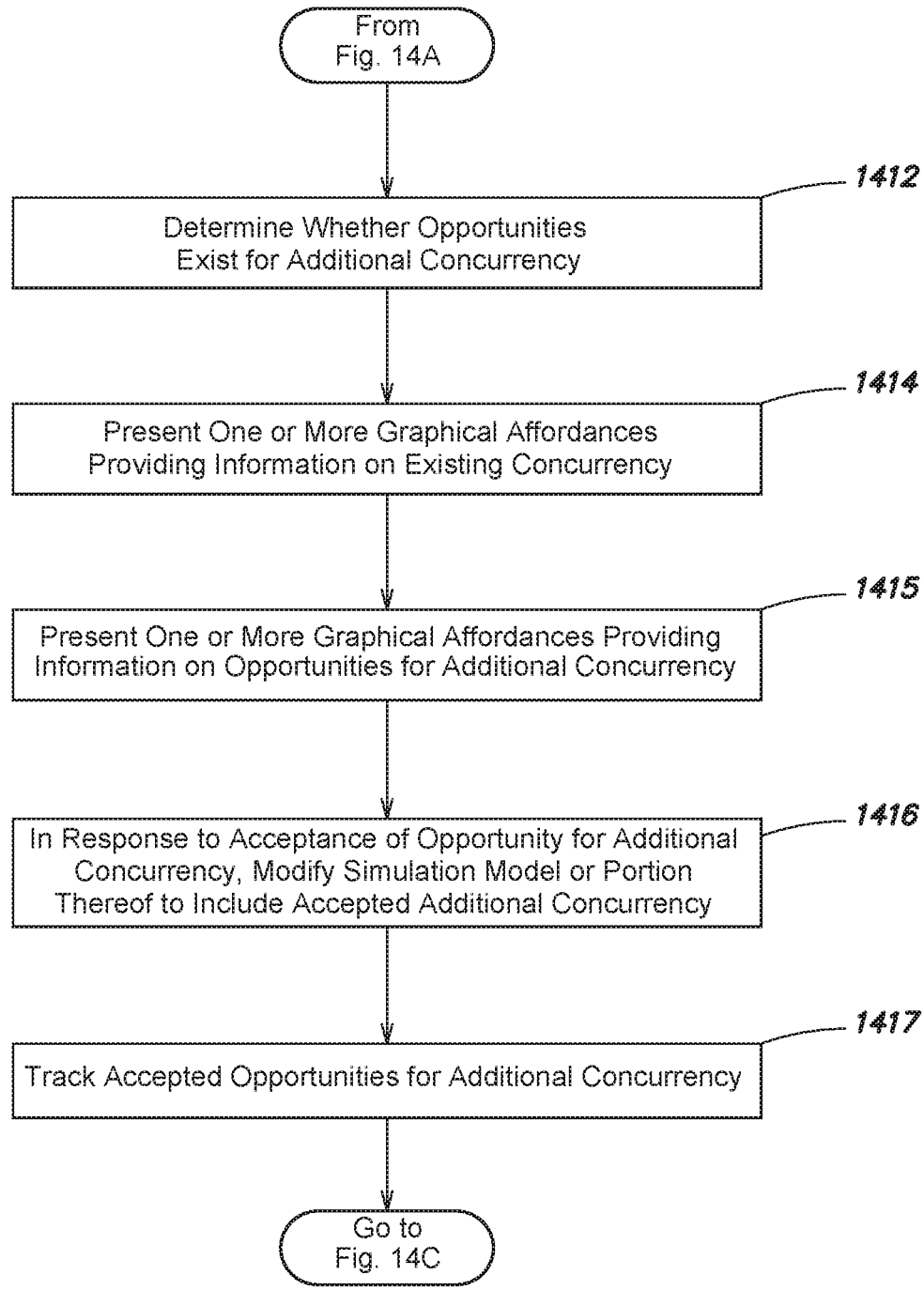
Figure 14C:
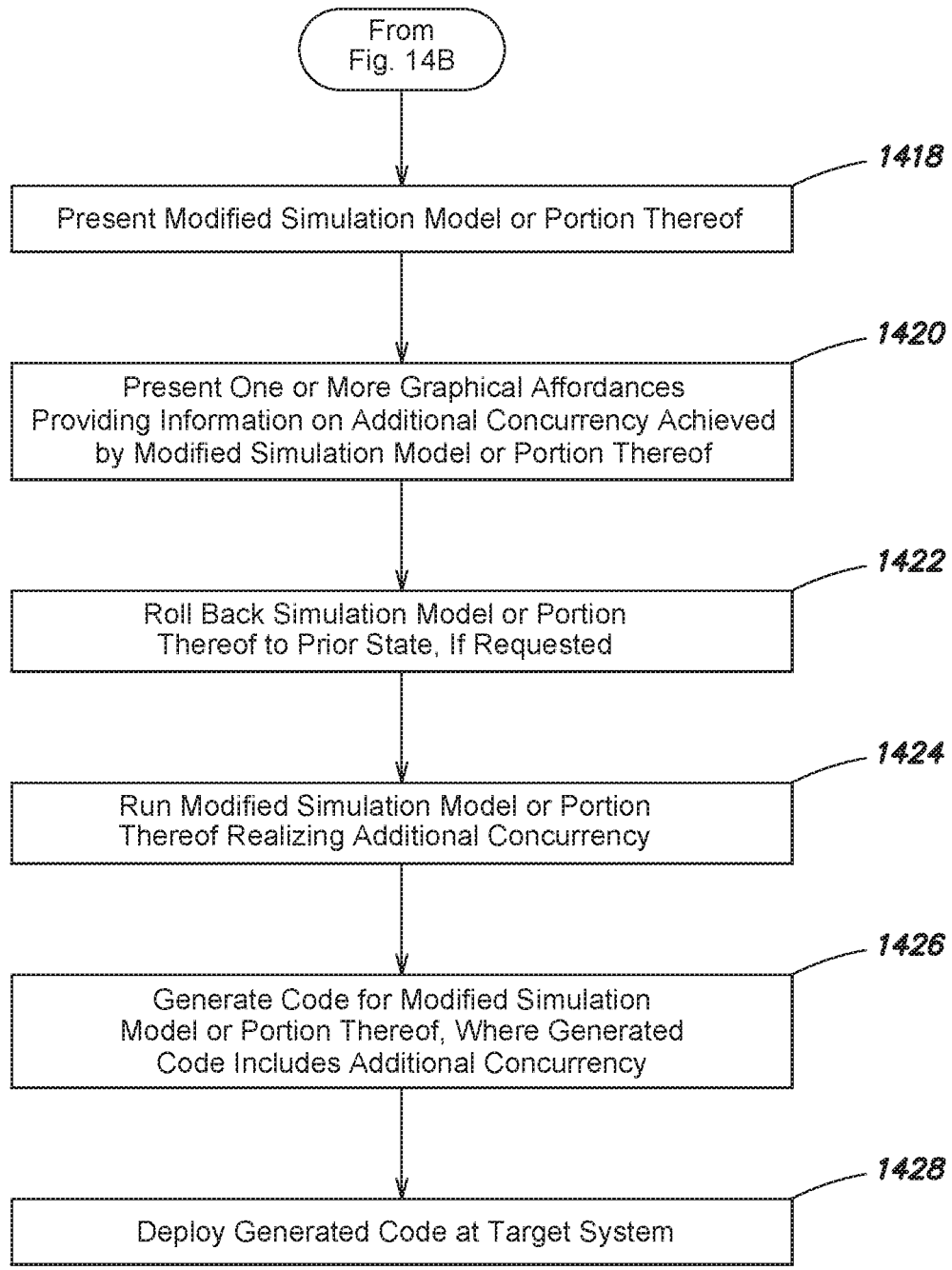

FIGS. 14A-C are partial views of a flow diagram of an example method for identifying existing concurrency and determining opportunities for additional concurrency in accordance with one or more embodiments.

The concurrency engine 114 may access a simulation model or portion thereof for analysis, as indicated at block 1402. The concurrency engine 114 also may receive one or more constraints or parameters for the concurrency analysis, as indicated at block 1404. The model execution engine 112 may compile the simulation model or portion thereof, as indicated at block 1406. As part of the compilation process, IR builder 122 may generate one or more intermediate representations (IRs) of the model or portion thereof, as indicated at block 1408. The model analyzer 124 may analyze one or more of the IRs to identify existing concurrency in the model or portion thereof, as indicated at block 1410. The model analyzer 124 also may determine whether one or more opportunities exist to increase the concurrency of the model or portion thereof, for example through partitioning, pipelining, substitution, or unfolding, among other techniques, as indicated at block 1412 (FIG. 14B). In some embodiments, the determination may be made without translating the simulation model or portion thereof into a lower abstraction form. The UI engine 102 in cooperation with the concurrency engine 114 may present one or more graphical affordances that provide information on the existing concurrency identified in the model or portion thereof, as indicated at block 1414. The UI engine 102 in cooperation with the concurrency engine 114 also may provide information regarding the opportunities identified for increasing the concurrency, as indicated at block 1415.

For example, the one or more IRs may represent a graph of model elements, e.g., blocks, and their connectivity and the model analyzer 124 may trace existing concurrency and/or opportunities to increase concurrency identified within one or more of the IRs to respective elements, such as model elements, components, etc., of a visual presentation of a model, e.g., on a display device, using a tracing technique. A suitable tracing technique is described in U.S. Pat. No. 8,104,017 to Lin et al. for Traceability in a Modeling Environment, which is hereby incorporated by reference in its entirety. Accordingly, the concurrency engine 114 may display the effects of proposed additional concurrency determined at the one or more IR can be displayed at the model level and in relation to particular model elements, such as blocks, connection lines, ports, etc. In case of code included in a model, such as MATLAB code, C code, etc., the concurrency engine 114 can present concurrency suggestions in terms of code details, such as which code line(s) is affected, as described.

In some implementations, the concurrency engine 114 may perform concurrency analysis including the presentation of results of the concurrency analysis 'live'. For example, as the user changes latency, number of cores, execution cost, etc., suggested opportunities may be determined immediately, e.g., in real-time from the user's perspective, and can also be immediately updated on the model. Additionally or alternatively, the concurrency engine 114 may process more than one suggestion. For example, the user may enter an array of different costs, latencies, number of cores, etc. for the same model element and the concurrency suggestion for each of those can be displayed.

In some embodiments, the UI engine 102 in cooperation with the concurrency engine 114 may utilize one or more graphical affordances to designate regions of a simulation model, e.g., model elements, components, etc., that have been allocated to different threads for concurrent execution. For example, the UI engine 102 may use color coding in which the portion of the model allocated to one thread is presented in one color, the portion of the model allocated to another thread is presented in another color, the portion allocated to a further thread is presented in a further color, and so on. In other embodiments, other graphical affordances besides or in addition to color may be used.

In response to receiving an acceptance of one or more of the identified opportunities, the modification generator 126 may modify the model or portion thereof to increase the concurrency, as indicated at block 1416. As described, a user may selectively, e.g., for specific model elements or components, choose whether to adopt the concurrency suggestions at the level of specific model elements or components and change the model accordingly. The UI engine 102 in cooperation with the concurrency engine 114 may present a visual depiction of the model or portion thereof as modified, for example on a display of a data processing device, as indicated at block 1418 (FIG. 14C). The UI engine 102 in cooperation with the concurrency engine 114 may also present one or more graphical affordances providing information on additional concurrency achieved by the modified simulation model or portion thereof, as indicated at block 1420. If the user rejects or declines the modification, the concurrency engine 114 may roll back the simulation model or portion thereof to a prior state before the modification was made, as indicated at block 1422. In some embodiments, even if the user accepts the modification, the user may still choose to 'undo' the acceptance in which case the rollback may be performed. Optionally, the concurrency engine 114 may keep track of proposed model changes accepted by the user, as indicated at block 1417, so that generated code may include (e.g., in comments) which suggested changes the user accepted to achieve a particular construct (e.g., a particular thread).

If the modification is accepted, the model execution engine 112 may run the modified model or portion thereof realizing the additional concurrency provided by the concurrency engine 114, as indicated at block 1424. In addition to or instead of running the modified model or portion thereof, the code generator 108 may generate code for the modified model or portion thereof, as indicated at block

1426. The generated code may be deployed at a target system, such as an embedded controller, as indicated at block 1428.

Figure 15A:
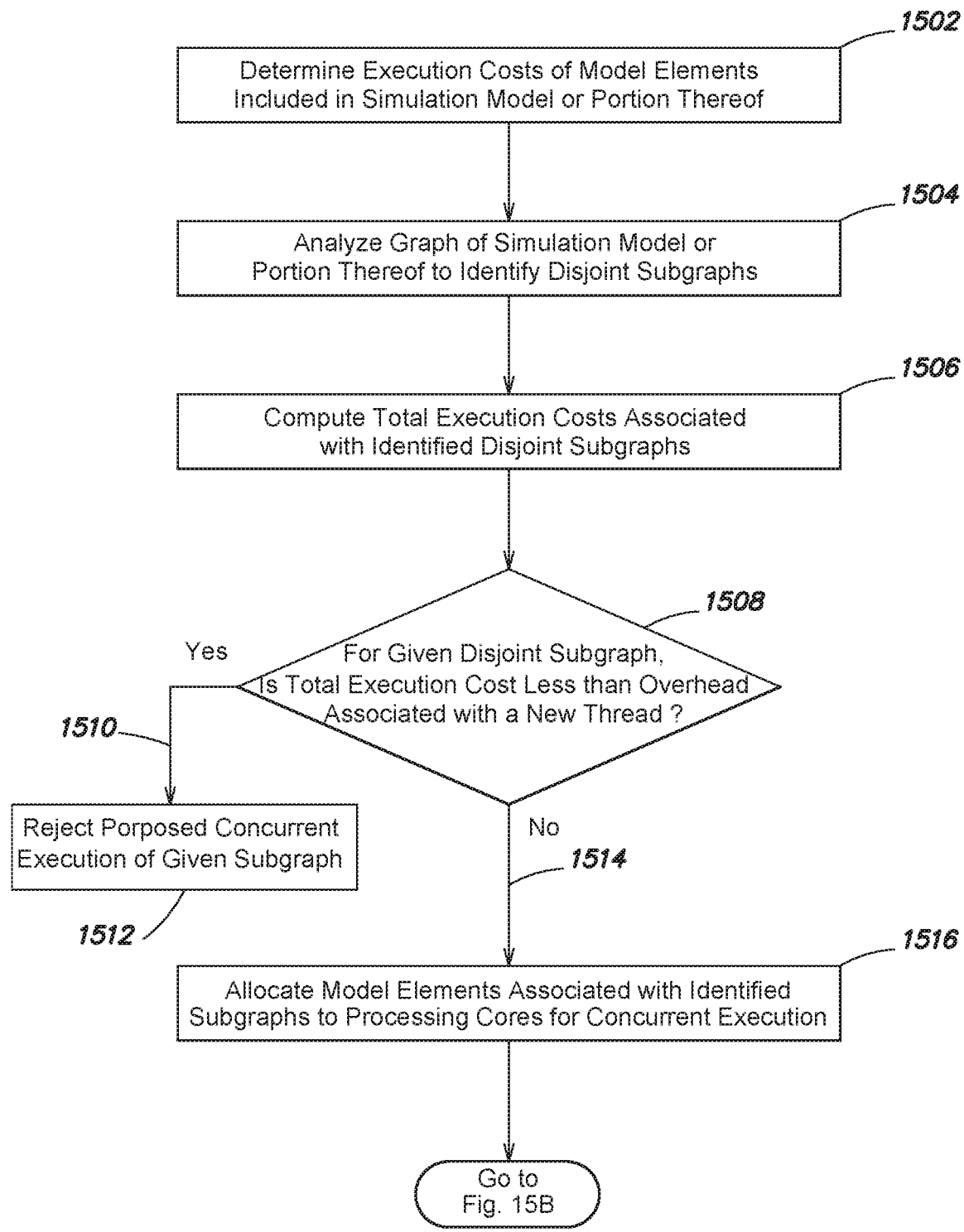
FIGS. 15A-C are partial views of a flow diagram an example method in accordance with one or more embodiments.
Figure 15B:
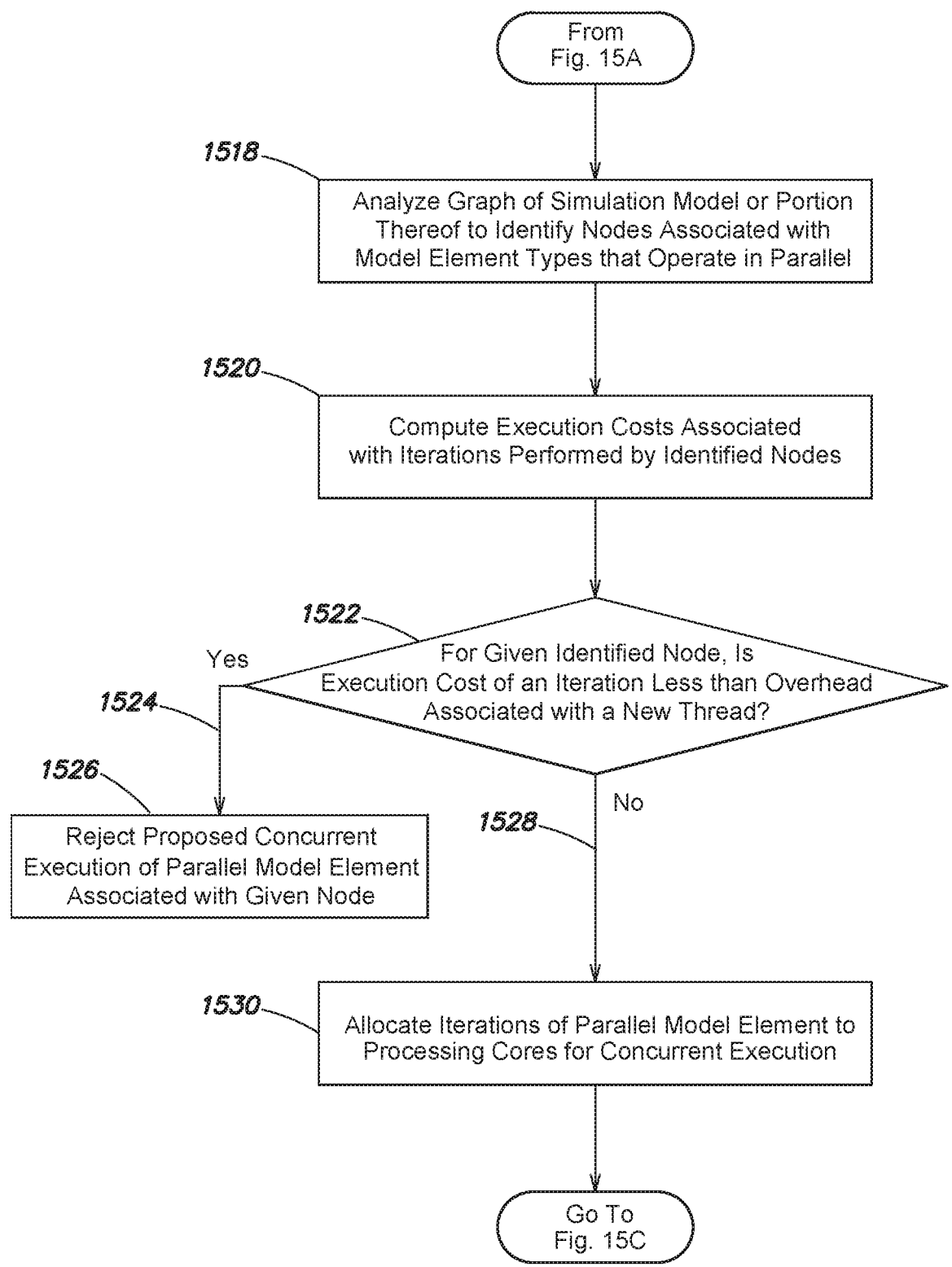
Figure 15C:
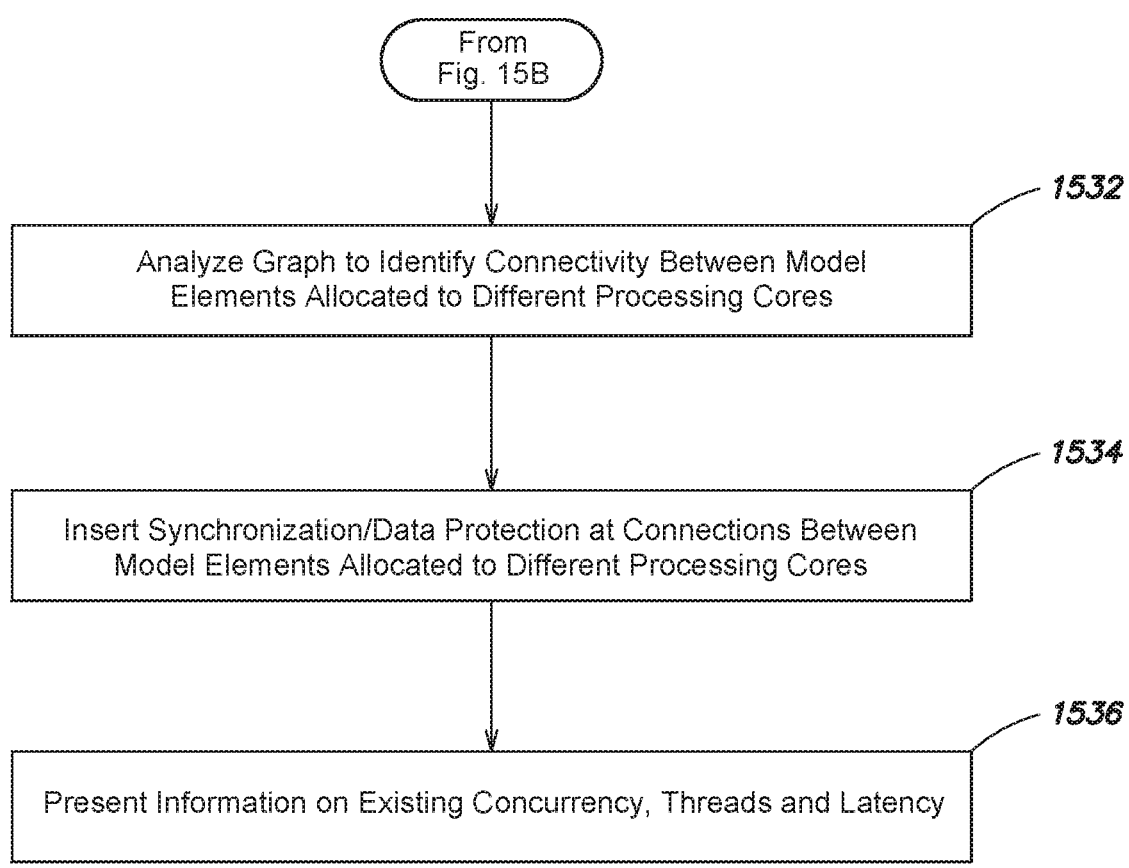

FIGS. 15A-C are partial views of a flow diagram of an example method for determining existing concurrency in accordance with one or more embodiments. The cost calculation engine 128 may determine execution costs of model elements included in the model or portion thereof being analyzed for additional opportunities for concurrency, as indicated at step 1502. The model analyzer 124 may analyze a graph of the model or portion thereof and identify disjoint subgraphs, as indicated at step 1504. The cost calculation engine 128 may compute total execution costs associated with the identified disjoint subgraphs, as indicated at step 1506. The model analyzer 124 may determine whether the costs of executing the model elements associated with a given disjoint subgraph are less than the overhead associated with having another thread, as indicated at decision step 1508. If so, the model analyzer 124 may reject the given subgraph for concurrent execution, as indicated by Yes arrow 1510 leading to step 1512. If not, the model analyzer 124 may allocate the model elements associated with the disjoint subgraphs to processing cores, as indicated by No arrow 1514 leading to step 1516.

The model analyzer 124 may analyze the graph to identify nodes associated with model element types that operate in parallel, as indicated at step 1518 (FIG. 15B). The cost calculation engine 128 may compute the execution cost of the iterations or other repeating elements of the identified model element that operates in parallel, as indicated at step 1520. For a given node associated with a model element type that operates in parallel, the model analyzer 124 may determine whether the execution cost of an iteration or repeating element are less than the overhead associated with having another thread, as indicated at decision step 1522. If so, the model analyzer 124 may reject configuring the model element for execution concurrently, as indicated by Yes arrow 1524 leading to step 1526. If not, the model analyzer 124 may allocate the iterations or other repeating elements of the model element operating in parallel to processing cores for concurrent execution, as indicated by No arrow 1528 leading to step 1530.

The model analyzer 124 may analyze the graph to identify connectivity between model elements allocated to different processing cores, as indicated at step 1532 (FIG. 15C). The model analyzer 124 may insert synchronization and/or data protection elements at the identified connections, such as one or more semaphores, as indicated at step 1534.

The UI engine 102 in cooperation with the concurrency engine 114 may present information on the existing concurrency, threads, and latency determined for the model or portion thereof, as indicated at step 1536.

Figure 16A:
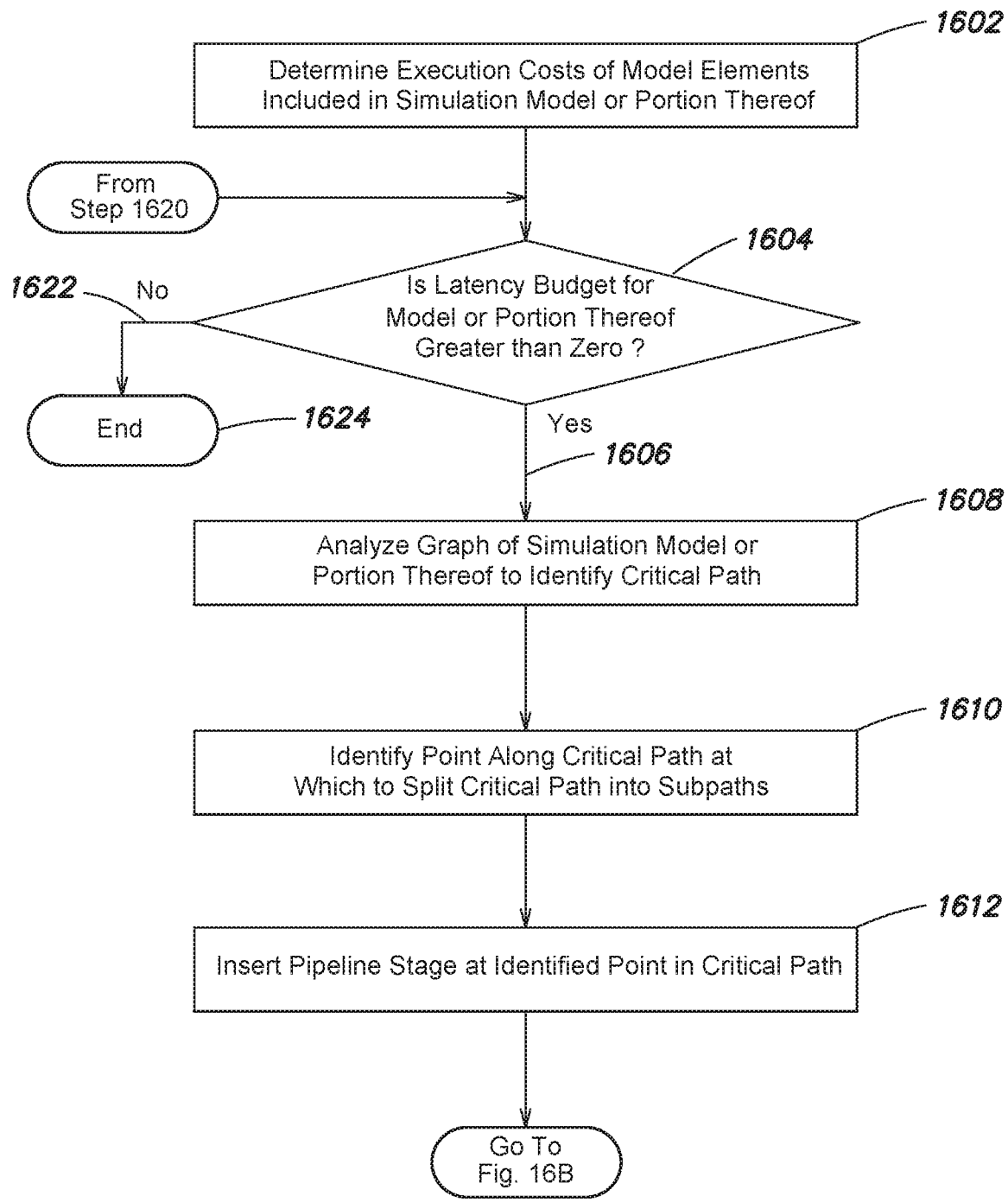
FIGS. 16A-B are partial views of a flow diagram an example method in accordance with one or more embodiments.
Figure 16B:
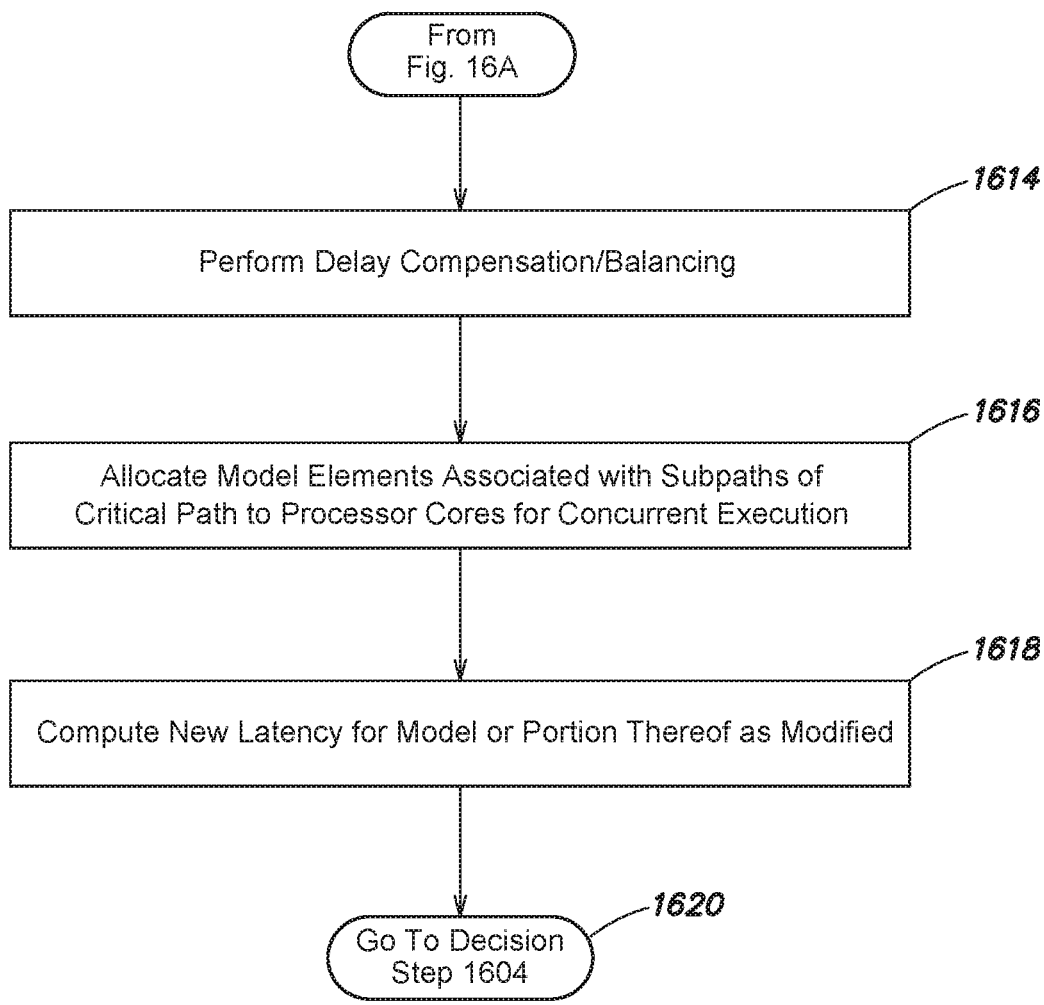

FIGS. 16A-B are partial views of a flow diagram of an example method of determining opportunities for increased concurrency by adding latency and pipelining in accordance with one or more embodiments. The cost calculation engine 128 may determine the execution costs of model elements included in a model or portion thereof being analyzed for concurrency, as indicated at step 1602. If a latency budget exists for the model or portion thereof, the model analyzer 124 may determine whether the latency budget is greater than zero, as indicated at decision step 1604. If so, the model analyzer 124 may analyze the graph of the simulation model or portion thereof, and identify the critical path of the model or portion thereof, as indicated by Yes arrow 1606 leading to step 1608. The model analyzer 124 may identify a point along the critical path at which to split the critical path into subpaths, as indicated at step 1610. The pipelining engine 150 may insert a pipeline stage at the identified point along the critical path, as indicated at step 1612.

Following the insertion of the pipeline stage, the delay compensator 152 may perform delay compensation and/or balancing of the graph and may insert one or more delays, as indicated at step 1614 (FIG. 16B). The model analyzer 124 may allocate model elements associated with the created subpaths to different processing cores for concurrent execution, as indicated at step 1616. The model analyzer 124 may compute a new latency of the model or portion thereof as modified by the insertion of one or more pipeline stages, as indicated at step 1618. Processing may then return to the decision step 1604 as indicated by Go To step 1620. In some embodiments, the process of breaking and/or dividing the critical path into subpaths may be repeated until the latency budget reaches zero or a value that does not support further pipeline given the cost granularity of the critical path. If the model analyzer 124 determines that the latency budget is zero, processing may be complete as indicated by No arrow 1622 leading to End step 1624.

The concurrency engine 114 may determine whether synchronization needs to be provided between threads running on different processing cores. If the concurrency engine 114 determines that two connected blocks of a model are mapped to two different threads/cores and a pipeline delay was added between the two blocks, then no synchronization may be needed. However, if two connected blocks of a model are mapped to two different threads/cores and there is no pipeline delay between them, the concurrency engine 114 may provide synchronization, e.g., in the form of semaphores, between the two blocks.

Figure 17:
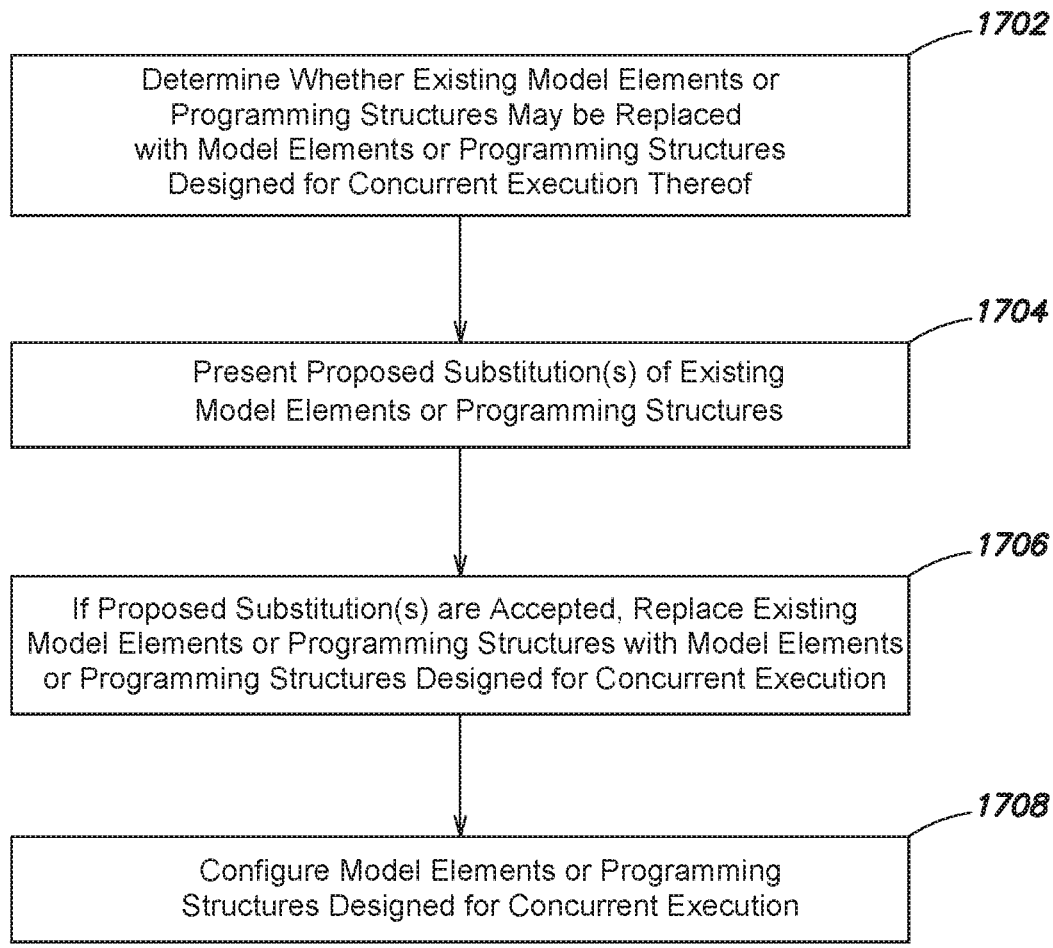
FIG. 17 is a flow diagram an example method in accordance with one or more embodiments.

FIG. 17 is a flow diagram of an example method for increasing concurrency by replacing one or more existing model elements or structures with parallel model elements or structures in accordance with one or more embodiments. The model analyzer 124 may analyze a model or portion thereof and determine whether it includes a model element or structure executing in parallel that may be replaced by a type of model element or type of programming structure designed for concurrent execution, as indicated at step 1702. If so, the UI engine 102 in cooperation with the model analyzer 124 may present a proposed modification to the model or portion thereof where the proposed modification includes substituting an existing model element or programming structure with a model element or programming structure designed for concurrent execution, as indicated at step 1704. If the proposed modification is accepted, e.g., by the user, the modification generator 126 may enter and/or save the proposed modification, as indicated at step 1706. The modification generator 126 may configure the substituted model element or programming structure for concurrent execution, as indicated at step 1708.

Figure 18:
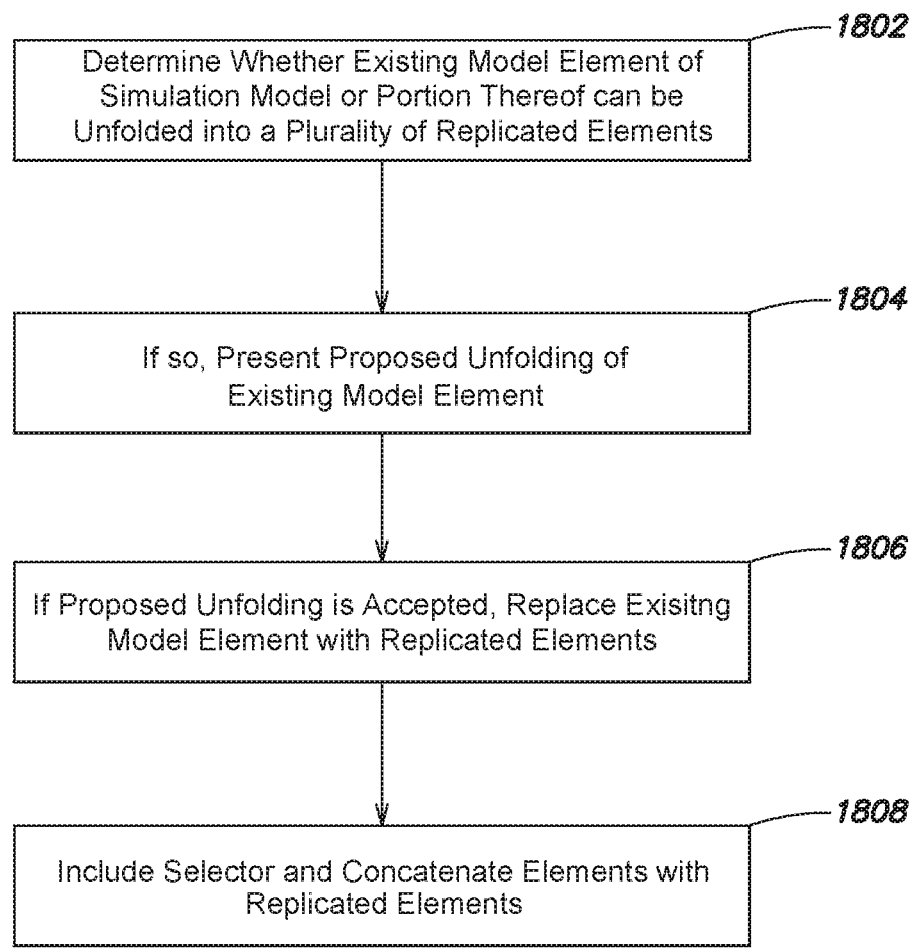
FIG. 18 is a flow diagram an example method in accordance with one or more embodiments.

FIG. 18 is a flow diagram of an example method for increasing concurrency by unfolding in accordance with one or more embodiments. The model analyzer 124 may analyze a simulation model or portion thereof, and determine whether an existing model element can be unfolded into a plurality of replicated elements, as indicated at block 1802. If so, the UI engine 102 in cooperation with the concurrency engine 114 may present a visual depiction of the proposed unfolding, as indicated at block 1804. If the proposed unfolding is accepted, e.g., by the user, the unfolding engine 154 may unfold the existing model element into a plurality of replicated elements having the same functionality as the model element being unfolded, as indicated at block 1806. The unfolding engine 154 also may add selector and concatenate elements and may connect them to the replicated elements, as indicated at block 1808.

Programming languages provide various levels of abstraction from the details of implementing a computer program in machine code. A low-level programming language, such as machine language, may provide little or no abstraction from a computer's instructions set architecture. Because it includes the implementation details, such as operation codes (opcodes) for the instructions, a program written in machine language can be converted to machine code without a compiler or interpreter. Assembly language provides a higher level of abstraction than machine language. Instead of dealing with opcodes directly, the programmer uses mnemonic names for instructions. An assembler converts the names into opcodes. Assembly is considered a mid-level programming language.

High-level programming languages, such as FORTRAN and C, provide increasingly more abstraction from the implementation details than mid-level languages. For example, instead of specifying the instructions to be used, a programmer may use natural language elements, and a compiler may determine what instructions or operations to use. Furthermore, high-level languages typically do not require a programmer programming in such languages to deal with registers, memory addresses, and call stacks. Instead, high-level languages use variables, arrays, objects, complex arithmetic or Boolean expressions, subroutines and functions, loops, threads, locks, and other abstract concepts. Languages providing even greater abstraction than high-level languages are referred to as higher-level programming languages.

Figure 19:
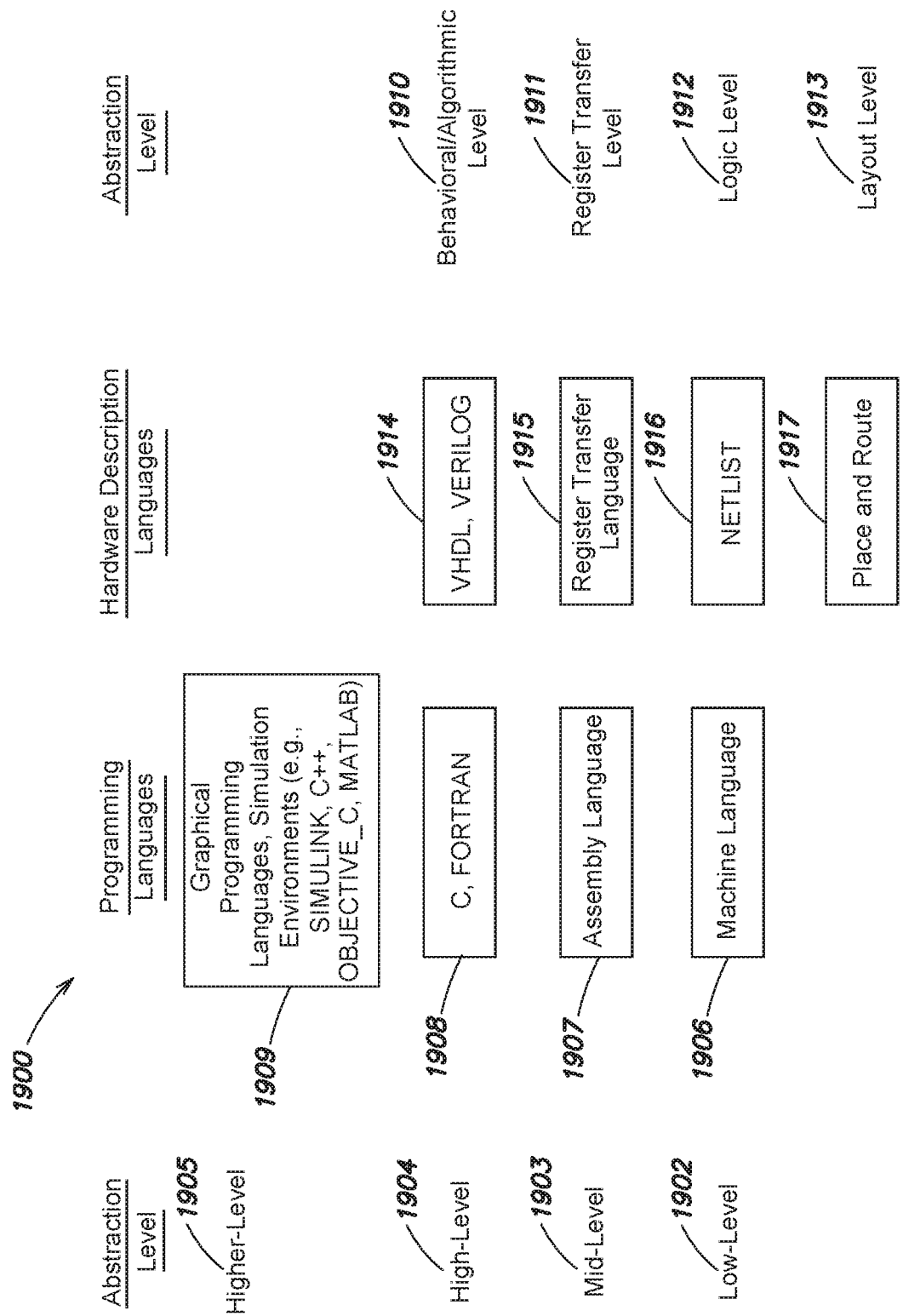
FIG. 19 is a schematic illustration of an example chart illustrating abstraction levels of computer programming languages.

FIG. 19 is a schematic illustration of an example chart 1900 illustrating the level of abstraction of several programming languages. The levels of abstraction may include a low-level 1902, a mid-level 1903, a high-level 1904, and a higher-level 1905. The language at the low-level 1902 may be machine language as indicated at 1906. The language at the mid-level 1903 may be assembly language as indicated at 1907. Languages at the high-level 1904 may include C and FORTRAN as indicated at 1908. Languages at the higher-level 1905 include graphical and visual programming languages as well as modeling and simulation environments, such as the Simulink® simulation environment and the MATLAB language/programming environment both from The MathWorks, Inc. of Natick, Mass. as indicated at 1909, from which C code (a high-level language) can be automatically generated. Other exemplary languages at the higher-level 1905 include the C++ and ObjectiveC programming languages, which both evolved from C, and add further abstractions that C lacks.

Higher-level 1905 and high-level 1904 languages may use natural language elements and may automate (or hide entirely) certain operation system services, such as memory management. Higher-level 1905 and high-level 1904 languages allow for programs to be written that do not depend intrinsically on the underlying instruction set of the computer on which they are run.

In addition to software programming languages, Hardware Description Languages (HDLs) exist for describing the structure and behavior of electronic devices, including circuits, such as digital logic circuits. HDLs are used to express the function of a circuit. A synthesis tool chain uses the HDL code to configure, e.g., synthesize, a target programmable logic device, such as an Application Specific Integrated Circuit (ASIC), a Field Programmable Gate Arrays (FPGA), a Complex Programmable Logic Device (CPLD), a System on a Chip (SoC), etc.

As with software programming languages, there are also different abstraction levels as HDL code is translated in order to synthesize the programmable logic device. For example, moving in a direction from more abstraction to less abstraction, the levels may include a Behavioral/Algorithmic level 1910, a Register Transfer Level (RTL) 1911, a Logic level 1912, and a Layout level 1913. Exemplary languages or circuit synthesis tools at the Behavioral/Algorithmic level 1910 include VHDL and Verilog as indicated at 1914, which may be used to describe the circuit's function. An exemplary language at the RTL level 1911 is a Register Transfer Language (RTL) as indicated at 1915, which divides a design into combinational logic and storage elements. At the Logic level 1912, a design is represented as a netlist as indicated at 1916. At the Layout level 1913, cells of the target programmable logic element are placed, and connections are routed as indicated at 1917. In terms of abstraction level, the RTL level 1911 is considered to be analogous to assembly language 1907, which is a mid-level programming language 1903.

The starting point for electronic device and/or circuit design may be a high-level language 1904, such as C, or a higher-level language 1905, such as the Simulink® simulation environment. For example, a code generator may automatically translate a program written in C, or a simulation model created in the Simulink® simulation is environment directly into VHDL or Verilog code. Programming languages classified at the high-level 1904 and the higher-level 1905 may provide greater levels of abstraction than languages at the Behavioral/Algorithmic level 1910. For example, graphical programming languages and simulation environments, such as the Simulink® simulation environment, do not provide an explicit hardware clock signal.

The systems and methods of the present disclosure including one or more of the model analyzer 124, the modification generator 126, and/or the cost calculation engine 128 may operate within a higher-level programming language, such as the simulation environment 100 used to create the graphical simulation models. The systems and methods of the present disclosure may identify existing concurrency and identify opportunities for increasing the concurrency of a simulation model or portion thereof without lowering or translating the simulation model into a form corresponding to a lower abstraction level for example by operating on the in-memory graph representation of the simulation model or portion thereof.

Exemplary simulation environments 100 suitable for use with the present disclosure include the MATLAB® language/programming environment and the Simulink® simulation environment both from The MathWorks, Inc. of Natick, Mass., as well as the Simscape™ physical modeling system, the SimEvent® discrete-event modeling tool, and the Stateflow® state chart tool also from The MathWorks, Inc., the MapleSim physical modeling and simulation tool from Waterloo Maple Inc. of Waterloo, Ontario, Canada, the LabVIEW virtual instrument programming system and the NI MatrixX model-based design product both from National Instruments Corp. of Austin, Tex., the Visual Engineering Environment (VEE) product from Keysight Technologies Inc. of Santa Rosa, Calif., the System Studio model-based signal processing algorithm design and analysis tool and the SPW signal processing algorithm tool from Synopsys, Inc. of Mountain View, Calif., a Unified Modeling Language (UML) system, a Systems Modeling Language (SysML) system, the System Generator system from Xilinx, Inc. of San Jose, Calif., the Modelica environment from the Modelica Association, and the Rational Rhapsody Design Manager software from IBM Corp. of Somers, N.Y.

A simulation model, such as the simulation model 132, may simulate, e.g., approximate the operation of, a real-world system. Exemplary systems include physical systems and/or dynamic systems, such as plants and controllers, signal processing systems, communications systems, computer vision systems, radar applications, etc. For example, the simulation model 132 may simulate a control system of a vehicle, such as an electronic control unit (ECU) of a car, truck, or airplane. Exemplary vehicle ECUs include anti-lock braking systems (ABS), engine or transmission controllers, autonomous vehicle systems, power window controllers, etc. Other real-world control systems that may be simulated include controllers for appliances, such as a smart refrigerators and home automation systems, controllers for factory automation systems, data transfer and/or communication systems, electronic circuits, financial systems or instruments, natural phenomena, such as weather patterns, etc. Other real-world systems include digital signal processing (DSP) systems, such as radar and vision systems, and communications systems, such as mobile phones. The simulation model may be constructed to mimic the operation of the real world system. For example, a simulation model may implement functionality that simulates operation of the system being designed or evaluated.

A simulation model may be executed in order to simulate the system being modeled, and the execution of a model may be referred to as simulating the model. Models constructed within the simulation environment 100 may include graphical models, such as block diagram models, state-based models, discrete-event models, physical models, and combinations thereof. A block diagram model may include icons or blocks that represent computations, functions or operations, and interconnecting lines or arrows among the blocks may represent data, control, signals, or mathematical relationships among those computations, functions, or operations. The blocks, moreover, may be selected by the user from the model element libraries 106. For example, the UI engine 102 may present one or more palettes containing icons representing model element types, and the user may select desired model element types for inclusion in the simulation model 132.

A model editor window, which may be generated by the UI engine 102, may include a Run button that may be selected by the user. The simulation environment 100 may also be configured to receive a run command entered by the user, e.g., in the GUI or in a Command Line Interface (CLI). In response to the user selecting the Run button or entering the run command (or another UI event), the model execution engine 112 may execute the simulation model, and may present the results of the model's execution, e.g., to a user.

The simulation model may be a Simulink model, a Stateflow chart, a LabVIEW block diagram, a VEE diagram, a MATLAB file, a MatrixX model, etc.

In some embodiments, computations associated with model elements may be distributed among different nodes of a distributed system, such as a cloud system. For example, a model may analyze vehicle traffic using data from one or more webcams and a ThingSpeak Internet of Things (IoT) analytics platform service. The analytics platform service may aggregate, visualize, and analyze live data streams from the one or more webcams.

The MATLAB language/programming environment supports late binding or dynamic typing, as opposed to describing a late binding language or a dynamically typed language/environment. The Simulink® simulation environment supports modeling and simulating dynamic and other systems, among other uses. The MATLAB® and Simulink® environments provide a number of high-level features that facilitate algorithm development and exploration. Exemplary high-level features include dynamic typing, array-based operations, data type inferencing, sample time inferencing, and execution order inferencing, among others.

In some embodiments, the simulation environment 100 may implement a declarative language. A declarative language is a language that expresses the logic of a computation without describing its control flow. A declarative language may describe what a program must accomplish in terms of the problem domain, rather than describe how to accomplish it as a sequence of programming language primitives. In some cases, a declarative language may implement single assignment in which variables are assigned once and only once. For example, the Simulink simulation environment, which is a time-based language, supports declarative modeling and also has imperative features. Behaviors of at least some of the model elements, e.g., blocks, and connection elements, e.g., arrows, of a simulation model may include computational implementations that are implicitly defined by a declarative language.

The code generator 108 may generate the generated code 146 for all or part of the final model 144. For example, the UI engine 102 may provide or support a Code Generation button in a GUI that may be selected by the user, or the UI engine 102 may receive a code generation command entered by the user, e.g., in the GUI or the CLI. The code generation command also may be invoked programmatically, for example, when a particular event occurs. In response to the code generation command being activated, the code generator 108 may generate the code 146, for the final simulation model 144 or a portion thereof. The behavior of the generated code 146 may be functionally equivalent to the behavior of the final model 144 or portion thereof.

Exemplary code generators include, but are not limited to, the Simulink Coder, the Embedded Coder, and the Simulink HDL Coder products from The MathWorks, Inc. of Natick, Mass., and the TargetLink product from dSpace GmbH of Paderborn Germany.

The generated code 146 may be textual code, such as textual source code, that may be compiled, for example by the compiler 110, and executed on a target machine or device, which may not include a simulation environment and/or a model execution engine. The generated code 146 may conform to one or more programming languages, such as Ada, Basic, C, C++, C#, SystemC, FORTRAN, etc. or to a hardware description language, such as VHDL, Verilog, a vendor or target specific HDL code, such as Xilinx FPGA libraries, assembly code, etc. The generated code 146 may include header, main, make, and other source files. The compiler 110 may compile the generated code 146 for execution by a target processor, such as a microprocessor, a Digital Signal Processor (DSP), a single or multi-core Central Processing Unit (CPU), a Graphics Processor (GPU), etc. In some embodiments, the generated code 146 may be accessed by a hardware synthesis tool chain, which may configure, e.g., synthesize, a programmable hardware device, such as a Field Programmable Gate Array (FPGA), a Complex Programmable Logic Device (CPLD), a System on a Chip (SoC), etc., from the generated code 146. The final simulation model 144 and the generated code 146 may be stored in memory, e.g., persistent memory, such as a hard drive or flash memory, of a data processing device.

The simulation environment 100 may be loaded into and run from the main memory of a data processing device.

In some implementations, the code generator 108 and/or the compiler 110 may be separate from the simulation environment 100, for example one or both of them may be separate application programs. The code generator 108 and/or the compiler 110 may also be run on different data processing devices than the data processing device running the simulation environment 100. In such embodiments, the code generator 108 may access the final model 144, e.g., from memory, and generate the generated code 146 without interacting with the simulation environment 100.

The model execution engine 112 may execute the model 200 over a simulation time beginning at a start time, e.g., 0.0 seconds, and ending at an end time, e.g., 10.0 seconds. A solver 120 may be selected, and the selected solver 120 may define a plurality of simulation time steps between the start and end times at which the model 200 may be solved. The size of the simulation time steps may be determined by the selected solver 120 used to solve the model 200. The selected solver 120 may generate a set of equations for the model 200, and repeatedly solve the equations at the simulation time steps. The solver may approximate the behavior of the model being executed at time t+dt based on the behavior of the model from the start time to time t. The quantity dt may be the step size determined by the selected solver, and the interval from t to t+dt may be referred to as a major time step. The solver 120 may need to evaluate the model at multiple times between major time steps to increase the accuracy of the evaluation at time t+dt. These intermediate times steps may be referred to as minor time steps.

The start time, simulation time steps, and end time may be logical and may have no correspondence with the physical passage of time. For example, the simulation time may be 10.0 seconds, although execution of the model 200 by the data processing device may be completed in a fraction of that in physical time. Alternatively, the start time, time steps, and end time may have a correspondence with the physical passage of time, and execution may occur in real time. Model execution may be carried out for one or more model inputs, such as a set of model inputs, and may produce one or more model results or outputs, such as a set of model outputs.

At least some model elements may include a sample time parameter. A block's sample time controls the rate at which it executes. Depending on their sample times, some blocks may execute once every time step, while other blocks may execute once every occurrence of some multiple of the time step, such as once every third or fourth time step. When a simulation time step matches the sample time for a model element, a sample time hit occurs, and the model element is scheduled for execution during that simulation step.

During execution, elements of the model 200 may produce outputs and, if appropriate, update their internal states at the model element's sample times. The sample times may be port-based or block-based. For block-based sample times, all of the inputs and outputs of the block may run at the same rate. For port-based sample times, the input and output ports of the block can run at different rates.

In some cases, an element's sample time may be inferred from one or more other model elements. For example, the sample time for a given model element may be indicated to be inherited, and the model execution engine 112 may determine or infer the sample time for the given model element, for example based on propagation. The model execution engine 112 may also determine or infer other unspecified execution information for the given model element, such as data type, complexity, and data dimension of the model element's inputs and/or outputs.

Sample times may be discrete, continuous, or inherited. Discrete sample times are fixed time increments that may be determined before model execution. Continuous sample times may be divided into major time steps and minor time steps, where the minor steps may represent subdivisions of the major steps. The selected solver 120 may determine the times of the minor steps, and may use results computed at minor time steps to improve the accuracy of the results computed at major time steps. Nonetheless, block outputs may only appear (e.g., be presented to the user or logged in a logical workspace or file) at the major time steps. It should be understood that other sample times may be used or defined, such as the fixed in minor step, constant, variable, triggered, and asynchronous, e.g., as provided by the Simulink® simulation environment.

A dynamic model may be executed by computing its states at successive time steps over the simulation time of the model. At least some of the connection elements of a dynamic model may represent signals, which may be time varying quantities that may have values throughout the model's simulation time. The source of a signal may be the model element that writes to the signal during execution of the model element. The destination of a signal may be the model element that reads the signal during execution of the model element.

Alternatively, a model may be an event-based system, such as a state transition diagram, that executes over a plurality of event steps. In another embodiment, a model may be a dataflow model in which case the one or more steps may be time or event based. An exemplary event in a dataflow model may be the availability of new data to be consumed. Simulation models may thus provide one or more of time-based, event-based, state-based, message-based, frequency-based, control-flow based, and dataflow-based execution semantics.

During the configuration and inferring of block and port/signal characteristics, compiled attributes, such as data dimensions, data types, data complexity, sample time, etc., of the blocks (and/or ports) may be determined based on block and/or port connections. For example, attributes may propagate through the model 200 from one block or component to the next following signal, data, control, state transition, mechanical, electrical, or other connectivity or dependency. For a model element whose behavior has been explicitly specified, propagation may ensure that the block's attributes are compatible with the attributes of the blocks connected to it. If not, an error or warning may be issued.

At least some model elements may be defined to be compatible with a wide range of attributes. Such model elements may adapt their behavior based on the attributes of the model elements connected to them. The exact implementation of the model element may thus be determined on the basis of the structure of the model in which the model element is located.

To the extent a model includes model elements or components configured to operate at different sample rates, the compilation phase may include validating that all rate-transitions yield deterministic results, and that the appropriate rate transition blocks are present in the model.

The manner in which model elements are interconnected may not define the order in which the equations or methods corresponding to the elements will be solved, e.g., executed. The actual order may be determined by the selected solver 120 during a sorting step of the compilation stage. In an embodiment, the sorted order, once determined, may be fixed for the entire duration of the model's execution, e.g., for the entire simulation time of the model.

Figure 20:
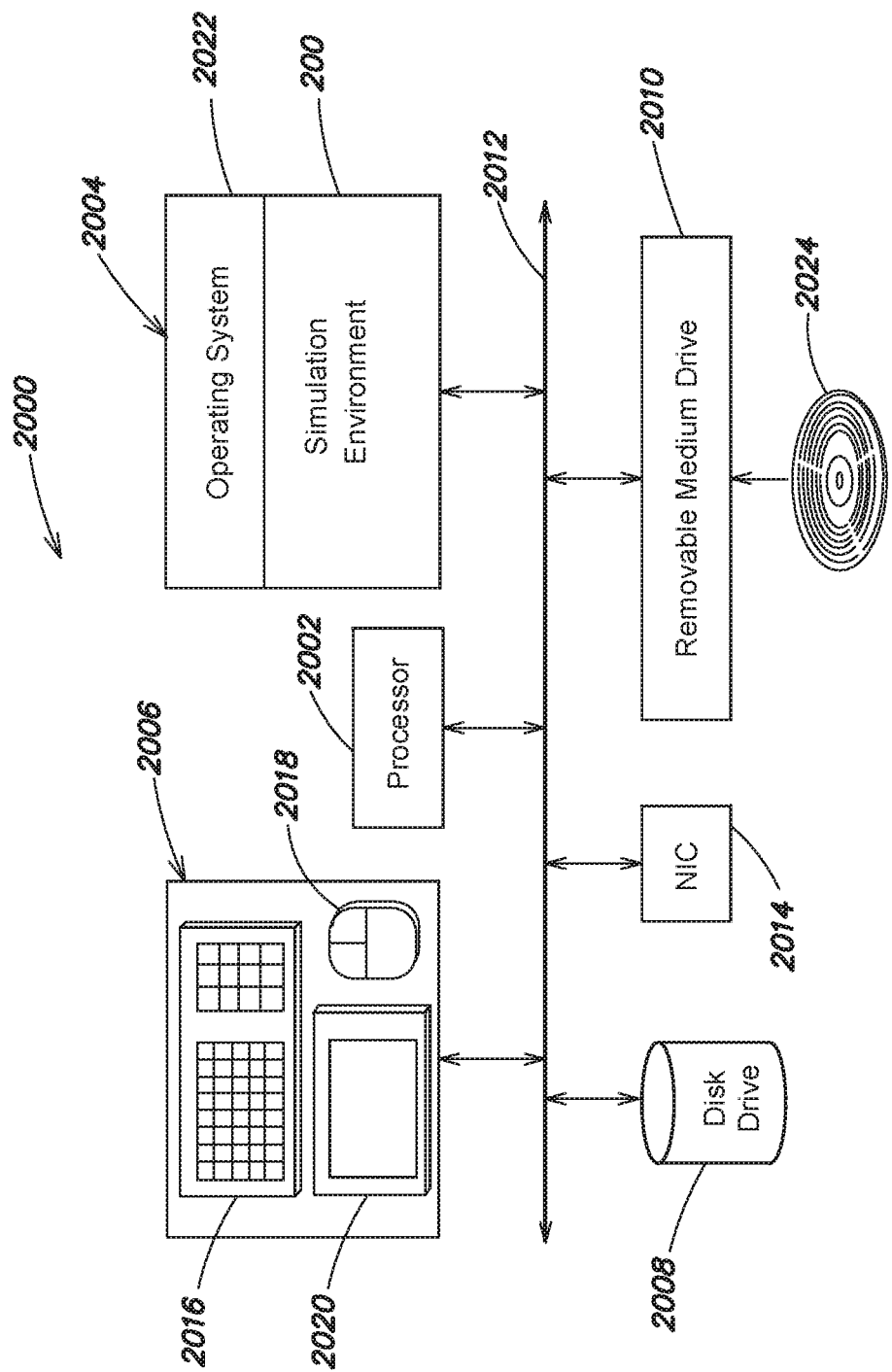
FIG. 20 is a schematic illustration of a data processing system for implementing one or more embodiments of the disclosure.

FIG. 20 is a schematic illustration of a computer or data processing system 2000 for implementing one or more embodiments of the disclosure. The computer system 2000 may include one or more processing elements, such as a processor 2002, a main memory 2004, user input/output (I/O) 2006, a persistent data storage unit, such as a disk drive 2008, and a removable medium drive 2010 that are interconnected by a system bus 2012. The computer system 2000 may also include a communication unit, such as a network interface card (NIC) 2014. The user I/O 2006 may include a keyboard 2016, a pointing device, such as a mouse 2018, and a display 2020. Other user I/O 2006 components include voice or speech command systems, other pointing devices include touchpads and touchscreens, and other output devices besides a display, include a printer, a projector, a touchscreen, etc. Exemplary processing elements include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 2004, which may be a Random Access Memory (RAM), may store a plurality of program libraries or modules, such as an operating system 2022, and one or more application programs that interface to the operating system 2022, such as the simulation environment 100, including the concurrency engine 114. One or more objects or data structures may also be stored in the main memory 2004, such as the simulation model 122, the final simulation model 144 (optimized for concurrency), and the generated code 146, among other data structures.

The removable medium drive 2010 may accept and read one or more computer readable media 2024, such as a CD, DVD, floppy disk, solid state drive, tape, flash memory or other media. The removable medium drive 2010 may also write to the one or more computer readable media 2024.

Suitable computer systems include personal computers (PCs), workstations, servers, laptops, tablets, palm computers, smart phones, electronic readers, and other portable computing devices, etc. Nonetheless, those skilled in the art will understand that the computer system 2000 of FIG. 20 is intended for illustrative purposes only, and that the present disclosure may be used with other computer systems, data processing systems, or computational devices. The present disclosure may also be used in a networked, e.g., client-server, computer architecture, or a public and/or private cloud computing arrangement. For example, the simulation environment 100 may be hosted on a server, and accessed by a remote client through an application hosting system, such as the Remote Desktop Connection tool from Microsoft Corp.

Suitable operating systems 2022 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 2022 may provide services or functions for other modules, such as allocating memory, organizing data according to a file system, prioritizing requests, etc. The operating system 2022 may run on a virtual machine, which may be provided by the data processing system 2000.

As indicated above, a user or developer, such as an engineer, scientist, programmer, etc., may utilize one or more input devices, such as the keyboard 2016, the mouse 2018, and the display 2020 to operate the simulation environment 100, and construct one or more simulation models, such as the simulation model 132.

Figure 21:
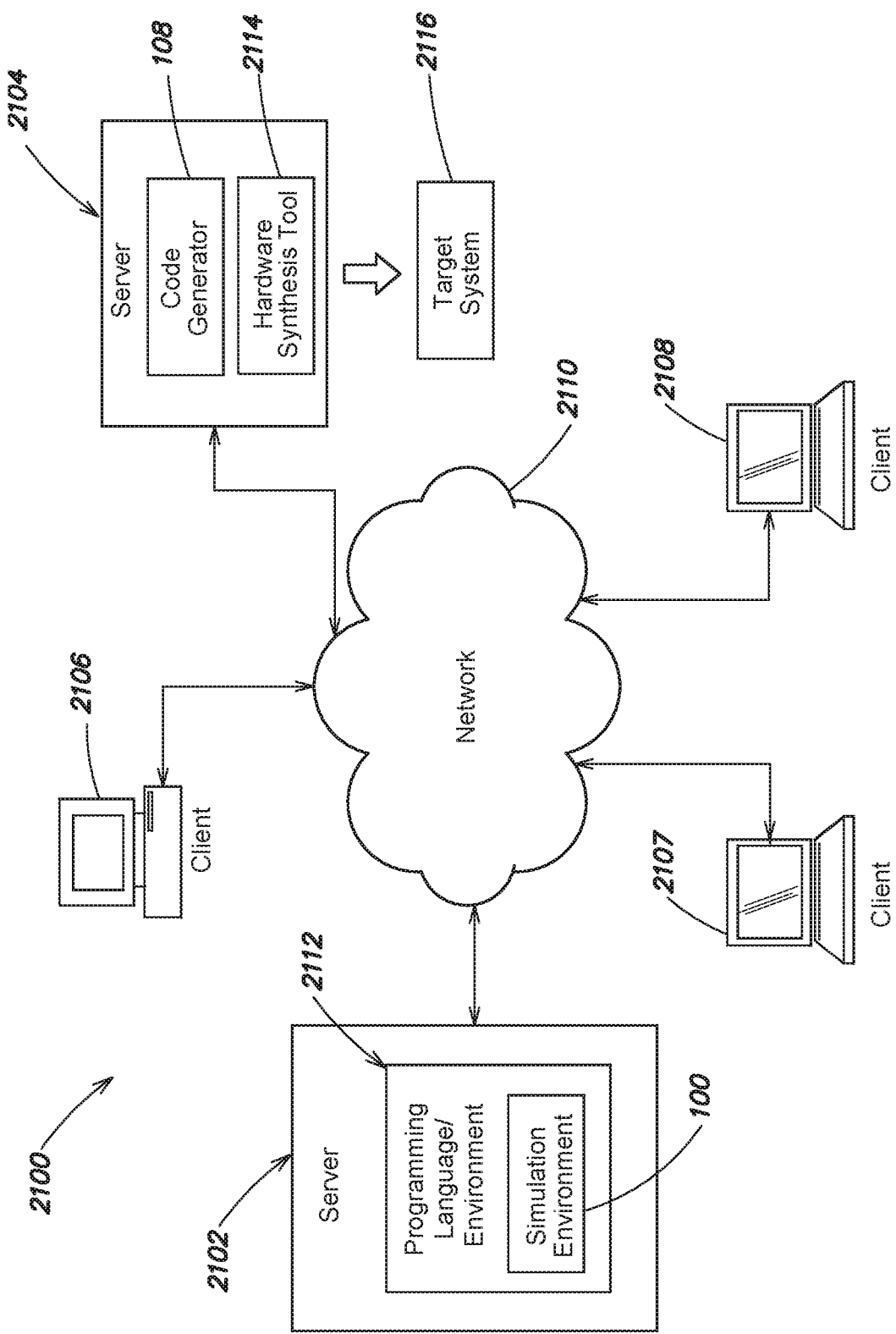
FIG. 21 is a schematic diagram of a distributed computing environment in which systems and/or methods of the disclosure may be implemented.

FIG. 21 is a schematic diagram of a distributed computing environment 2100 in which systems and/or methods described herein may be implemented. The environment 2100 may include client and server devices, such as two servers 2102 and 2104, and three clients 2106-2108, interconnected by one or more networks, such as network 2110. The devices of the environment 2100 may be interconnected via wired connections, wireless connections, or a combination of wired and wireless connections. The servers 2102 and 2104 may include one or more devices capable of receiving, generating, storing, processing, executing, and/or providing information. For example, the servers 2102 and 2104 may include a computing device, such as a server, a desktop computer, a laptop computer, a tablet computer, a handheld computer, or a similar device.

The clients 2106-2108 may be capable of receiving, generating, storing, processing, executing, and/or providing information. Information may include any type of machine-readable information having substantially any format that may be adapted for use, e.g., in one or more networks and/or with one or more devices. The information may include digital information and/or analog information. The information may further be packetized and/or non-packetized. In an embodiment, the clients 2106-2108 may download data and/or code from the servers 2102 and 2104 via the network 2110. In some implementations, the clients 2106-2108 may be desktop computers, workstations, laptop computers, tablet computers, handheld computers, mobile phones (e.g., smart phones, radiotelephones, etc.), electronic readers, or similar devices. In some implementations, the clients 2106-2108 may receive information from and/or transmit information to the servers 2102 and 2104.

The network 2110 may include one or more wired and/or wireless networks. For example, the network 2110 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, and/or a combination of these or other types of networks. Information may be exchanged between network devices using any network protocol, such as, but not limited to, the Internet Protocol (IP), Asynchronous Transfer Mode (ATM), Synchronous Optical Network (SONET), the User Datagram Protocol (UDP), Institute of Electrical and Electronics Engineers (IEEE) 802.11, etc.

The servers 2102 and 2104 may host applications or processes accessible by the clients 2106-2108. For example, the server 2102 may include a programming language/environment 2112, which may include or have access to the simulation environment 100. The server 2104 may include a code generator, such as the code generator 108, and a hardware synthesis tool 2114. The code generator 108 may generate code for a simulation model, such as HDL code, which may be provided to the hardware synthesis tool 2114. The hardware synthesis tool 2114 may translate the generated code into a bitstream or other format, and may synthesize, e.g., configure, a target system 2116, which may be a real-world system. In this way, the functionality defined by the simulation model may be deployed to a real-world system. For example, the hardware synthesis tool 2114 may configure a programmable logic device, such as a Field Programmable Gate Array (FPGA) or other Programmable Logic Device (PLD), of the target system 2116.

The number of devices and/or networks shown in FIG. 21 is provided as an example. In practice, there may be additional devices and/or networks, fewer devices and/or networks, different devices and/or networks, or differently arranged devices and/or networks than those shown in FIG. 21. Furthermore, two or more devices shown in FIG. 21 may be implemented within a single device, or a single device shown in FIG. 21 may be implemented as multiple, distributed devices. Additionally, one or more of the devices of the distributed computing environment 2100 may perform one or more functions described as being performed by another one or more devices of the environment 2100.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel. Also, the term "user", as used herein, is intended to be broadly interpreted to include, for example, a computer or data processing system (e.g., system 100) or a human user of a computer or data processing system, unless otherwise stated.

Further, certain embodiments of the disclosure may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 1000. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. For example, while the present disclosure describes allocating model portions to threads, model portions may additionally or alternatively be allocated to processes instead of threads. Therefore, it is the object of the appended claims to cover all such variations and modifications as come within the true spirit and scope of the disclosure.

What is claimed is:

1. A method comprising:
   identifying, by one or more processors, execution concurrency present in an executable simulation model through a first analysis of the executable simulation model;
   presenting, on a display coupled to the one or more processors, one or more first graphical affordances that disclose the execution concurrency identified in the executable simulation model, the one or more first graphical affordances (i) presented in association with a first visual depiction of the executable simulation model and (ii) indicating a location in the executable simulation model of the execution concurrency;
   identifying, by the one or more processors, an opportunity for increasing the execution concurrency in the executable simulation model through a second analysis of the executable simulation model;
   presenting, on the display, one or more second graphical affordances associated with the executable simulation model, where the one or more second graphical affordances indicate a proposed modification to the executable simulation model to implement the opportunity for increasing the execution concurrency in the executable simulation model, the one or more second graphical affordances (i) presented in association with the first visual depiction of the executable simulation model or a second visual depiction of the executable simulation model and (ii) indicating a location in the executable simulation model of the opportunity for increasing the execution concurrency; and
   altering the executable simulation model, by the one or more processors, to include the proposed modification that increases the execution concurrency in the executable simulation model, the altering producing a modified executable simulation model.

2. The method of claim 1 further comprising:
   presenting, on the display, one or more third graphical affordances that include a latency introduced into the executable simulation model resulting from the proposed modification.

3. The method of claim 1 wherein the opportunity for increasing the execution concurrency in the executable simulation model is realized by at least one of:
   partitioning the executable simulation model into a plurality of partitions and assigning the plurality of partitions to separate threads;
   substituting a first model element included in the executable simulation model with a substitute model element that is optimized for concurrent execution, where the first model element performs functionality and the substitute model element provides the same functionality as the first model element; or
   unfolding a second model element included in the executable simulation model into a plurality of replicated model elements.

4. The method of claim 3 wherein the partitioning includes:
   evaluating a cost overhead for a given one of the separate threads associated with a given one of the plurality of partitions; and
   rejecting the given one of the plurality of partitions when the cost overhead exceeds an execution cost associated with the given one of the plurality of partitions.

5. The method of claim 3 further comprising:
   executing the modified executable simulation model on a data processing device having a number of cores, wherein the plurality of the partitions is based on the number of cores of the data processing device.

6. The method of claim 3 wherein the executable simulation model includes a plurality of hierarchical levels and the partitioning is performed across two or more of the plurality of hierarchical levels.

7. The method of claim 1 wherein the altering is performed in response to receiving an indication accepting the proposed modification to the executable simulation model.

8. The method of claim 1 further comprising:
identifying additional opportunities for further increasing the execution concurrency in the executable simulation model;
preparing further proposed modifications to the executable simulation model, where the further proposed modifications realize the additional opportunities for further increasing the execution concurrency in the executable simulation model; and
altering the executable simulation model or the modified executable simulation model to include a plurality of the further proposed modifications for further increasing the execution concurrency in the executable simulation model or the modified executable simulation model, wherein the altering the executable simulation model or the modified executable simulation model to include the plurality of the further proposed modifications is performed in an incremental manner.

9. The method of claim 8 further comprising:
receiving an indication declining a given one of the plurality of the further proposed modifications; and
un-doing the given one of the plurality of the further proposed modifications, the un-doing rolling the executable simulation model back to a prior design state.

10. The method of claim 8 further comprising:
receiving a latency budget for the executable simulation model;
determining that a given one of the additional opportunities for further increasing the execution concurrency in the executable simulation model exceeds the latency budget; and
rejecting the given one of the additional opportunities.

11. The method of claim 8 wherein the altering the executable simulation model or the modified executable simulation model produces a further modified executable simulation model, the method further comprising:
generating code for the further modified executable simulation model, wherein the code conforms to a programming language or a hardware description language;
tracing the plurality of the further proposed modifications for further increasing the execution concurrency in the executable simulation model or the modified executable simulation model to locations in the code where the further proposed modifications are implemented; and
including information regarding the further proposed modifications at the locations in the code.

12. The method of claim 11 wherein the including the information regarding the further proposed modifications at the locations in the code includes adding one or more comments to the code concerning the further proposed modifications.

13. The method of claim 1 further comprising:
generating code for the modified executable simulation model, wherein the code conforms to a programming language or a hardware description language and implements the proposed modification that increases the execution concurrency.

14. The method of claim 1 further comprising:
receiving one or more constraints on a concurrency analysis, wherein at least one of the identifying the execution concurrency or the identifying the opportunity for increasing the execution concurrency is based on the one or more constraints.

15. The method of claim 14 wherein the one or more constraints include one or more of:
a number of processing cores of a target processor;
a latency budget for the concurrency analysis;
a designation that a selected model element of the executable simulation model executes on a specific one of the processing cores of the target processor;
a designation that a set of model elements of the executable simulation model be executed on a particular one of the processing cores of the target processor;
a designation that the concurrency analysis not be performed on one or more portions of the executable simulation model; or
a designation that the concurrency analysis minimizes memory usage.

16. The method of claim 14 wherein the receiving the one or more constraints, the identifying the opportunity for increasing the execution concurrency, and the presenting the one or more second graphical affordances is performed live from a user perspective.

17. One or more non-transitory computer-readable media, having stored thereon instructions that when executed by a computing device, cause the computing device to perform operations comprising:
identifying execution concurrency present in an executable simulation model through a first analysis of the executable simulation model;
presenting, on a display, one or more first graphical affordances that disclose the execution concurrency identified in the executable simulation model, the one or more first graphical affordances (i) presented in association with a first visual depiction of the executable simulation model and (ii) indicating a location in the executable simulation model of the execution concurrency;
identifying an opportunity for increasing the execution concurrency in the executable simulation model through a second analysis of the executable simulation model;
presenting, on the display, one or more second graphical affordances associated with the executable simulation model, where the one or more second graphical affordances indicate a proposed modification to the executable simulation model to implement the opportunity for increasing the execution concurrency in the executable simulation model, the one or more second graphical affordances (i) presented in association with the first visual depiction of the executable simulation model or a second visual depiction of the executable simulation model and (ii) indicating a location in the executable simulation model of the opportunity for increasing the execution concurrency; and
altering the executable simulation model to include the proposed modification that increases the execution concurrency in the executable simulation model, the altering producing a modified executable simulation model.

18. The one or more non-transitory computer-readable media of claim 17 wherein the instructions cause the computing device to perform operations further comprising:
presenting, on the display, one or more third graphical affordances that include a latency introduced into the executable simulation model resulting from the proposed modification.

19. The one or more non-transitory computer-readable media of claim 17 wherein the opportunity for increasing the execution concurrency in the executable simulation model is realized by at least one of:
    partitioning the executable simulation model into a plurality of partitions and assigning the plurality of partitions to separate threads;
    substituting a first model element included in the executable simulation model with a substitute model element that is optimized for concurrent execution, where the first model element performs functionality and the substitute model element provides the same functionality as the first model element; or
    unfolding a second model element included in the executable simulation model into a plurality of replicated model elements.

20. The one or more non-transitory computer-readable media of claim 19 wherein the partitioning includes:
    evaluating a cost overhead for a given one of the separate threads associated with a given one of the plurality of partitions; and
    rejecting the given one of the plurality of partitions when the cost overhead exceeds an execution cost associated with the given one of the plurality of partitions.

21. The one or more non-transitory computer-readable media of claim 19 wherein the instructions cause the computing device to perform operations further comprising:
    executing the modified executable simulation model on a data processing device having a number of cores, wherein the plurality of the partitions is based on the number of cores of the data processing device.

22. The one or more non-transitory computer-readable media of claim 19 wherein the executable simulation model includes a plurality of hierarchical levels and the partitioning is performed across two or more of the plurality of hierarchical levels.

23. The one or more non-transitory computer-readable media of claim 17 wherein the altering is performed in response to receiving an indication accepting the proposed modification to the executable simulation model.

24. The one or more non-transitory computer-readable media of claim 17 wherein the instructions cause the computing device to perform operations further comprising:
    identifying additional opportunities for further increasing the execution concurrency in the executable simulation model;
    preparing further proposed modifications to the executable simulation model, where the further proposed modifications realize the additional opportunities for further increasing the execution concurrency in the executable simulation model; and
    altering the executable simulation model or the modified executable simulation model to include a plurality of the further proposed modifications for further increasing the execution concurrency in the executable simulation model or the modified executable simulation model, wherein the altering the executable simulation model or the modified executable simulation model to include the plurality of the further proposed modifications is performed in an incremental manner.

25. The one or more non-transitory computer-readable media of claim 24 wherein the instructions cause the computing device to perform operations further comprising:
    receiving an indication declining a given one of the plurality of the further proposed modifications; and
    un-doing the given one of the plurality of the further proposed modifications, the un-doing rolling the executable simulation model back to a prior design state.

26. The one or more non-transitory computer-readable media of claim 24 wherein the instructions cause the computing device to perform operations further comprising:
    receiving a latency budget for the executable simulation model;
    determining that a given one of the additional opportunities for further increasing the execution concurrency in the executable simulation model exceeds the latency budget; and
    rejecting the given one of the additional opportunities.

27. The one or more non-transitory computer-readable media of claim 24 wherein the altering the executable simulation model or the modified executable simulation model produces a further modified executable simulation model, and further wherein the instructions cause the computing device to perform operations further comprising:
    generating code for the further modified executable simulation model, wherein the code conforms to a programming language or a hardware description language;
    tracing the plurality of the further proposed modifications for further increasing the execution concurrency in the executable simulation model or the modified executable simulation model to locations in the code where the further proposed modifications are implemented; and
    including information regarding the further proposed modifications at the locations in the code.

28. The one or more non-transitory computer-readable media of claim 27 wherein the including the information regarding the further proposed modifications at the locations in the code includes adding one or more comments to the code concerning the further proposed modifications.

29. The one or more non-transitory computer-readable media of claim 17 wherein the instructions cause the computing device to perform operations further comprising:
    generating code for the modified executable simulation model, wherein the code conforms to a programming language or a hardware description language and implements the proposed modification that increases the execution concurrency.

30. The one or more non-transitory computer-readable media of claim 17 wherein the instructions cause the computing device to perform operations further comprising:
    receiving one or more constraints on a concurrency analysis, wherein at least one of the identifying the execution concurrency or the identifying the opportunity for increasing the execution concurrency is based on the one or more constraints.

31. An apparatus comprising:
    one or more memories configured to store an executable simulation model;
    a display; and
    one or more processors coupled to the one or more memories and to the display, the one or more processors configured to:
        identify execution concurrency present in the executable simulation model through an analysis of the executable simulation model;
        present, on the display, one or more first graphical affordances that disclose the execution concurrency identified in the executable simulation model, the one or more first graphical affordances (i) presented in association with a first visual depiction of the executable simulation model and (ii) indicating a location in the executable simulation model of the execution concurrency;

determine an opportunity for increasing the execution concurrency in the executable simulation model;

present, on the display, one or more second graphical affordances associated with the executable simulation model, where the one or more second graphical affordances indicate a proposed modification to the executable simulation model to implement the opportunity for increasing the execution concurrency in the executable simulation model, the one or more second graphical affordances (i) presented in association with the first visual depiction of the executable simulation model or a second visual depiction of the executable simulation model and (ii) indicating a location in the executable simulation model of the opportunity for increasing the execution concurrency; and alter the executable simulation model to include the proposed modification that increases the execution concurrency in the executable simulation model, the altering producing a modified executable simulation model.

32. The apparatus of claim 31 wherein the one or more processors are further configured to:

present, on the display, one or more third graphical affordances that include a latency introduced into the executable simulation model resulting from the proposed modification.

33. The apparatus of claim 31 wherein the opportunity for increasing the execution concurrency in the executable simulation model is realized by at least one of:

partitioning the executable simulation model into a plurality of partitions and assigning the plurality of partitions to separate threads;

substituting a first model element included in the executable simulation model with a substitute model element that is optimized for concurrent execution, where the first model element performs functionality and the substitute model element provides the same functionality as the first model element; or unfolding a second model element included in the executable simulation model into a plurality of replicated model elements.

34. The apparatus of claim 31 wherein the one or more processors are further configured to:

receive one or more constraints on a concurrency analysis, wherein at least one of the identifying the execution concurrency or the identifying the opportunity for increasing the execution concurrency is based on the one or more constraints.

35. The apparatus of claim 34 wherein the one or more constraints include one or more of:

a number of processing cores of a target processor;

a latency budget for the concurrency analysis;

a designation that a selected model element of the executable simulation model executes on a specific one of the processing cores of the target processor;

a designation that a set of model elements of the executable simulation model be executed on a particular one of the processing cores of the target processor;

a designation that the concurrency analysis not be performed on one or more portions of the executable simulation model; or a designation that the concurrency analysis minimizes memory usage.

\* \* \* \* \*

UNITED STATES PATENT AND TRADEMARK OFFICE
CERTIFICATE OF CORRECTION

| | | |
|---|---|---|
| PATENT NO. | : 11,593,540 B1 | Page 1 of 1 |
| APPLICATION NO. | : 16/427908 | |
| DATED | : February 28, 2023 | |
| INVENTOR(S) | : Katalin M. Popovici et al. | |

It is certified that error appears in the above-identified patent and that said Letters Patent is hereby corrected as shown below:

In the Specification

Column 17, Line 45:
"'Ns', respectively. The UI engine 102 may locate the badge"
Should read:
--'Pts', respectively. The UI engine 102 may locate the badge--

Signed and Sealed this
Twentieth Day of May, 2025

Coke Morgan Stewart
*Acting Director of the United States Patent and Trademark Office*